(12) United States Patent
Wei et al.

(10) Patent No.: US 11,839,123 B2
(45) Date of Patent: Dec. 5, 2023

(54) DISPLAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Feng Wei, Beijing (CN); Hongjun Zhou, Beijing (CN); Lili Du, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 39 days.

(21) Appl. No.: 17/635,871

(22) PCT Filed: Mar. 11, 2021

(86) PCT No.: PCT/CN2021/080199
§ 371 (c)(1),
(2) Date: Feb. 16, 2022

(87) PCT Pub. No.: WO2022/188091
PCT Pub. Date: Sep. 15, 2022

(65) Prior Publication Data
US 2023/0165077 A1 May 25, 2023

(51) Int. Cl.
*H10K 59/131* (2023.01)
*G09G 3/00* (2006.01)
(Continued)

(52) U.S. Cl.
CPC ........... *H10K 59/131* (2023.02); *G09G 3/006* (2013.01); *G09G 3/3233* (2013.01);
(Continued)

(58) Field of Classification Search
CPC ..... G09G 3/006; G09G 3/3233; H10K 59/131
See application file for complete search history.

(56) References Cited

U.S. PATENT DOCUMENTS 11,205,357 B2 * 12/2021 Xiong .................. G09G 3/3275
11,341,878 B2 5/2022 Kim et al.
(Continued)

FOREIGN PATENT DOCUMENTS

CN 105974689 A 9/2016
CN 107134474 A 9/2017
(Continued)

OTHER PUBLICATIONS

International Search Report in PCT/CN2021/080199, dated Nov. 25, 2021 in English.
(Continued)

*Primary Examiner* — Sardis F Azongha
(74) *Attorney, Agent, or Firm* — Collard & Roe, P.C.

(57) ABSTRACT

A display substrate and a display device are disclosed. The display substrate includes a base substrate, a plurality of sub-pixels, a plurality of data lines, a control signal line, data test lines, a test circuit and an auxiliary electrode line. The test circuit includes a plurality of test units, each of at least one of the plurality of test units includes a first control line and a plurality of control switches, the auxiliary electrode line and the first control line are connected in parallel with each other, and an orthographic projection of a part of at least one control switch among the plurality of control switches on a substrate surface of the base substrate is located between an orthographic projection of the first control line and an orthographic projection of the auxiliary electrode line on the substrate surface of the base substrate.

20 Claims, 7 Drawing Sheets

(51) Int. Cl.
  *G09G 3/3233* (2016.01)
  *H10K 59/88* (2023.01)
(52) U.S. Cl.
  CPC .............. *G09G 2300/0426* (2013.01); *G09G 2300/0842* (2013.01); *G09G 2330/04* (2013.01); *G09G 2330/12* (2013.01); *H10K 59/88* (2023.02)

(56) References Cited

U.S. PATENT DOCUMENTS

| | | |
|---|---|---|
| 2006/0214894 A1 | 9/2006 | Cheng et al. |
| 2007/0152218 A1 | 7/2007 | Hung |
| 2008/0192162 A1 | 8/2008 | Hayakawa et al. |
| 2014/0176844 A1 | 6/2014 | Yanagisawa |
| 2021/0327909 A1 | 10/2021 | Yan |
| 2022/0115407 A1 | 4/2022 | Lin et al. |

FOREIGN PATENT DOCUMENTS

| | | |
|---|---|---|
| CN | 109872632 A | 6/2019 |
| CN | 110176464 A | 8/2019 |
| CN | 110579913 A | 12/2019 |
| CN | 110993617 A | 4/2020 |
| CN | 111474790 A | 7/2020 |
| CN | 111681552 A | 9/2020 |
| CN | 111739474 A | 10/2020 |
| CN | 111785226 A | 10/2020 |
| TW | 200725134 A | 7/2007 |

OTHER PUBLICATIONS

International Search Report in PCT/CN2021/080199 in Chinese dated Nov. 25, 2021.
Written Opinion in PCT/CN2021/080199 in Chinese dated Nov. 25, 2021.

* cited by examiner

DISPLAY SUBSTRATE AND DISPLAY DEVICE

CROSS REFERENCE TO RELATED APPLICATIONS

This application is the National Stage of PCT/CN2021/080199 filed on Mar. 11, 2021, the disclosure of which is incorporated by reference.

TECHNICAL FIELD

Embodiments of the present disclosure relate to a display substrate and a display device.

BACKGROUND

For Organic Light-Emitting Diode (OLED) display products, there are many types of circuit units, such as pixel circuit, Gate Driver on Array (GOA), Multiplexer (MUX) and Cell Test (CT). Each of these circuits plays its own role in display. Among them, the cell test unit, as a test circuit structure, plays an important role in a panel test stage of the display product by detecting whether pixel units of the display product perform display functions normally.

SUMMARY

At least one embodiment of the present disclosure provides a display substrate, the display substrate includes a base substrate, a plurality of sub-pixels, a plurality of data lines, a control signal line, a plurality of data test lines, a test circuit and an auxiliary electrode line. The base substrate includes a display area and a peripheral area at least located at one side of the display area; the plurality of sub-pixels are located in the display area and arranged in an array; the plurality of data lines are located in the display area and configured to provide data signals to the plurality of sub-pixels; the control signal line is located in the peripheral area and at least located at one side of the display area; the plurality of data test lines are located in the peripheral area and at least located at one side of the display area; the test circuit is located in the peripheral area and electrically connected with the plurality of data lines, the control signal line and the plurality of data test lines, respectively, and configured to transmit test signals to the plurality of data lines through the plurality of data test lines under a control of the control signal line. The test circuit includes a plurality of test units, and each of at least one test unit of the plurality of test units includes a first control line and a plurality of control switches, and each of the plurality of control switches includes a control terminal, the first control line is connected with the control signal line and control terminals of the plurality of control switches; and the auxiliary electrode line is located in the peripheral area and connected in parallel with the first control line, and an orthographic projection of a part of at least one control switch of the plurality of control switches on a substrate surface of the base substrate is located between an orthographic projection of the first control line on the substrate surface of the base substrate and an orthographic projection of the auxiliary electrode line on the substrate surface of the base substrate.

For example, in the display substrate provided by at least one embodiment of the present disclosure, the first control line and the auxiliary electrode line are located in different layers with respect to the base substrate; and the first control line and the auxiliary electrode line are respectively located in a first conductive layer and a second conductive layer which are spaced apart and insulated from each other.

For example, in the display substrate provided by at least one embodiment of the present disclosure, the auxiliary electrode line is located at a side of the test circuit away from the display area or located at a side of the test circuit close to the display area.

For example, the display substrate provided by at least one embodiment of the present disclosure further includes an electrostatic discharge circuit arranged between the test circuit and the display area; the electrostatic discharge circuit is electrically connected with the plurality of data lines; and the auxiliary electrode line is located between the test circuit and the electrostatic discharge circuit.

For example, the display substrate provided by at least one embodiment of the present disclosure further includes a plurality of connecting wires respectively arranged between the plurality of control switches; the first control line is overlapped with active layers of the plurality of control switches, and overlapped parts of the first control line and the active layers form the control terminals of the plurality of control switches; and first ends of the plurality of connecting wires are connected with the first control line, and second ends of the plurality of connecting wires are connected with the auxiliary electrode line.

For example, in the display substrate provided by at least one embodiment of the present disclosure, the plurality of data test lines extend along a first direction at the side of the test circuit away from the display area and are arranged at intervals along a second direction, and the first direction intersects with the second direction; first terminals of the plurality of control switches are correspondingly connected with the plurality of data test lines respectively and are configured to receive test signals provided by the plurality of data test lines; and second ends of the plurality of control switches are correspondingly electrically connected with the plurality of data lines, respectively.

For example, the display substrate provided by at least one embodiment of the present disclosure further includes a plurality of first lead segments and a plurality of data leads, the plurality of first lead segments and the plurality of data leads extend along the second direction; the plurality of first lead segments are correspondingly connected with the plurality of data test lines and the first terminals of the plurality of control switches, respectively; and the plurality of data leads are correspondingly connected with the second ends of the plurality of control switches and the plurality of data lines, respectively.

For example, in the display substrate provided by at least one embodiment of the present disclosure, the plurality of data leads include second lead segments, a plurality of the second lead segments are correspondingly connected with the second ends of the plurality of control switches and the electrostatic discharge circuit, respectively; the plurality of first lead segments and the plurality of second lead segments are located in a third conductive layer, the third conductive layer is located between the first conductive layer and the second conductive layer and is spaced apart from and insulated from the first conductive layer and the second conductive layer; and orthographic projections of the plurality of second lead segments on the substrate surface of the base substrate and the orthographic projection of the auxiliary electrode on the substrate surface of the base substrate are overlapped each other.

For example, in the display substrate provided by at least one embodiment of the present disclosure, the plurality of data leads further include third lead segments, the third lead segments are located in the peripheral area and between the display area and the electrostatic discharge circuit; one end of each of a plurality of the third lead segments is electrically connected with a control terminal of the electrostatic discharge circuit, and other ends of the plurality of third lead segments are correspondingly connected with the plurality of data lines, respectively; and the third lead segments are located in the third conductive layer.

For example, in the display substrate provided by at least one embodiment of the present disclosure, at least one of the plurality of sub-pixels includes a pixel driving circuit and a light-emitting element; the pixel driving circuit includes a semiconductor layer, a first display area metal layer, a second display area metal layer and a third display area metal layer, and the light-emitting element is located at a side of the pixel driving circuit away from the base substrate and is connected with the third display area metal layer of the pixel driving circuit; a first insulating layer is located on the base substrate, the semiconductor layer is located at a side of the first display area metal layer close to the base substrate, the second display area metal layer is located at a side of the first display area metal layer away from the base substrate, the third display area metal layer is located at a side of the second display area metal layer away from the base substrate; the first conductive layer and the first display area metal layer are arranged in a same layer; the third conductive layer and the second display area metal layer are arranged in a same layer; the second conductive layer and the third display area metal layer are arranged in a same layer; the active layers of the plurality of control switches and the semiconductor layer are arranged in a same layer; the plurality of connecting wires are located in the first conductive layer, and the second ends of the plurality of connecting wires are connected with the auxiliary electrode line.

For example, in the display substrate provided by at least one embodiment of the present disclosure, the pixel driving circuit further includes a first transistor and a storage capacitor, the first transistor includes a gate electrode, a source electrode, a drain electrode and an active layer, and the storage capacitor includes a first electrode plate and a second electrode plate; the active layer of the first transistor is located in the semiconductor layer, the gate electrode and the first electrode plate are located in the first display area metal layer, the second electrode plate is located in the second display area metal layer, and the source electrode and the drain electrode are located in the third display area metal layer.

For example, in the display substrate provided by at least one embodiment of the present disclosure, the test circuit further includes at least one dummy test unit, the at least one dummy test unit is located at a side of the test circuit away from the plurality of test units, and the second conductive layer includes a plurality of first adapter electrodes; each of the at least one dummy test unit includes a plurality of dummy control switches, first terminals of the plurality of dummy control switches are correspondingly connected with the plurality of data test lines, respectively, control terminals of the plurality of dummy control switches are connected with the first control line, and the plurality of first adapter electrodes are respectively connected with the first terminals and second terminals of the plurality of dummy control switches.

For example, the display substrate provided by at least one embodiment of the present disclosure further includes a plurality of power lines routed around at least one side of the display area; the plurality of power lines include a first power line configured to provide a first power signal and a second power line configured to provide a second power signal; at least part of the first power line and at least part of the second power line are located in the second conductive layer; the first power line is routed at a side of the electrostatic discharge circuit away from the display area, the second power line is routed at a side of the electrostatic discharge circuit close to the display area, and the first power line and the second power line are respectively connected with a first terminal and a second terminal of the electrostatic discharge circuit; the electrostatic discharge circuit includes a plurality of first electrostatic discharge units; ends of the plurality of second lead segments away from the test circuit are correspondingly connected with control terminals of the plurality of first electrostatic discharge units, respectively.

For example, in the display substrate provided by at least one embodiment of the present disclosure, the test circuit and the electrostatic discharge circuit are located at a first side of the display area; and a second side and a third side of the display area are opposite to each other and adjacent to the first side; the plurality of data test lines include a first data test line, a second data test line and a third data test line; at least part of the first data test line and at least part of the second data test line are routed around the second side and the first side of the display area, and the second data test line is located at a side of the first data test line close to the display area; at least part of the third data test line and at least part of the control signal line are routed around the third side and the first side of the display area, and the control signal line is located at a side of the third data test line close to the display area; at a side of the test circuit away from the display area, the second data test line is located between the first data test line and the third data test line, the first data test line is located at a side away from the test circuit, the first conductive layer includes a first connecting trace extending along the second direction, and the semiconductor layer includes a plurality of first resistors; a first end of the control signal line is located at the first side of the display area and close to the test circuit, one end of the first connecting trace is connected with the first end of the control signal line, and the other end of the first connecting trace is connected with an end of the first control line close to the third side of the display area; a first end of the first data test line and a first end of the second data test line are located at the side of the test circuit away from the display area; at least one of the plurality of first resistors is connected with the first end of the first data test line and to the control signal line, and at least another one of the plurality of first resistors is connected with the first end of the second data test line and to the control signal line.

For example, in the display substrate provided by at least one embodiment of the present disclosure, at least one selected from the group consisted of the first data test line, the second data test line, the third data test line, the control signal line and the first control line is connected with the electrostatic discharge circuit.

For example, in the display substrate provided by at least one embodiment of the present disclosure, the electrostatic discharge circuit further includes a second electrostatic discharge unit which is located at least at one side of the plurality of first electrostatic discharge units and is located at a side close to the third side of the display area; the first conductive layer includes a second connecting trace and a third connecting trace, the semiconductor layer includes a second resistor; one end of the second connecting trace is connected with a control terminal of the second electrostatic discharge unit, and the other end of the second connecting trace is connected with the first end of the control signal line; the second resistor is connected with the control terminal of the second electrostatic discharge unit and the first power line; the electrostatic discharge circuit further includes a third electrostatic discharge unit which is located at a side of the second electrostatic discharge unit close to the third side of the display area; one end of the third connecting trace is connected with the third data test line, and the other end of the third connecting trace is connected with a control terminal of the third electrostatic discharge unit.

For example, in the display substrate provided by at least one embodiment of the present disclosure, the first conductive layer further includes a fourth connecting trace extending along the second direction, the semiconductor layer includes a third resistor, the second conductive layer includes a second adapter electrode extending along the first direction; a first end of the fourth connecting trace is connected with an end of the first control line close to the second side of the display area; a second end of the fourth connecting trace is connected with a first terminal of the second adapter electrode; a first end of the third data test line is located at the side of the test circuit away from the display area; and the third resistor is connected with a second terminal of the second adapter electrode and the first end of the third data test line.

For example, in the display substrate provided by at least one embodiment of the present disclosure, the first conductive layer further includes a fifth connecting trace, and the electrostatic discharge circuit further includes a fourth electrostatic discharge unit, which is located at a side of the first electrostatic discharge units close to the second side of the display area; one end of the fifth connecting trace is connected with the second end of the fourth connecting trace, and the other end of the fifth connecting trace is connected with a control terminal of the fourth electrostatic discharge unit.

For example, in the display substrate provided by at least one embodiment of the present disclosure, the first conductive layer further includes a sixth connecting trace and a seventh connecting trace, and the electrostatic discharge circuit further includes a fifth electrostatic discharge unit and a sixth electrostatic discharge unit; the sixth electrostatic discharge unit is located at a side of the fourth electrostatic discharge unit close to the second side of the display area, and the fifth electrostatic discharge unit is located between the fourth electrostatic discharge unit and the sixth electrostatic discharge unit; one end of the sixth connecting trace is connected with the first data test line, and the other end of the sixth connecting trace is connected with a control terminal of the fifth electrostatic discharge unit; one end of the seventh connecting trace is connected with the second data test line, and the other end of the seventh connecting trace is connected with a control terminal of the sixth electrostatic discharge unit.

For example, the display substrate provided by at least one embodiment of the present disclosure further includes a bonding area and a signal access unit located at a fourth side of the display area opposite to the first side, the signal access unit is located between the bonding area and the display area, and the bonding area includes a plurality of contact pads arranged along the first direction; the plurality of contact pads include a first contact pad and a second contact pad which are close to the second side of the display area, and a third contact pad and a fourth contact pad which are close to the third side of the display area; a second end of the first data test line extends to the fourth side of the display area and is connected with the second contact pad; a second end of the second data test line extends to the fourth side of the display area and is connected with the first contact pad; a second end of the control signal line extends to the fourth side of the display area and is connected with the third contact pad; and a second end of the third data test line extends to the fourth side of the display area and is connected with the fourth contact pad.

For example, in the display substrate provided by at least one embodiment of the present disclosure, the first data test line, the second data test line, the third data test line and the control signal line are partly located in the second conductive layer.

For example, in the display substrate provided by at least one embodiment of the present disclosure, the plurality of power lines further include a third power line and a fourth power line; the third power line is configured to provide a third power signal to the plurality of sub-pixels; the fourth power line is configured to provide a fourth power signal to the plurality of sub-pixels; the plurality of contact pads further include a fifth contact pad, a sixth contact pad, a seventh contact pad and an eighth contact pad; the seventh contact pad is located at a side of the second contact pad close to the second side of the display area, and the eighth contact pad is located at a side of the fourth contact pad close to the third side of the display area; the fifth contact pad is located between the seventh contact pad and the second contact pad, the sixth contact pad is located between the fourth contact pad and the eighth contact pad; two ends of the third power line are respectively connected with the seventh contact pad and the eighth contact pad, the third power line is routed around the display area, and the third power line is located at a side of the first data test line and the third data test line away from the display area; two ends of the fourth power line are respectively connected with the fifth contact pad and the sixth contact pad, the fourth power line is routed between the signal access unit and the display area and extends to the display area; an orthographic projection of the fourth power line on the substrate surface of the base substrate is overlapped with orthographic projections of the first data test line, the second data test line, the third data test line and the control signal line on the substrate surface of the base substrate; and in an area where the orthographic projection of the fourth power line on the substrate surface of the base substrate is overlapped with the orthographic projections of the first data test line, the second data test line, the third data test line and the control signal line on the substrate surface of the base substrate, the fourth power line is located in the second conductive layer, and the first data test line, the second data test line, the third data test line and the control signal line are spaced apart from and insulated from the second conductive layer.

For example, in the display substrate provided by at least one embodiment of the present disclosure, the first data test line includes a first part connected with its first end, a second part connected with its second end, and an eighth connecting trace; the first part and the second part of the first data test line are located in the second conductive layer, and the eighth connecting trace is located in the first conductive layer; two ends of the eighth connecting trace are connected with the first part and the second part of the first data test line respectively; the second data test line includes a first part connected with its first end, a second part connected with its second end, and a ninth connecting trace; the first part and the second part of the second data test line are located in the second conductive layer, and the ninth connecting trace is located in the first conductive layer; two ends of the ninth connecting trace are connected with the first part and the second part of the second data test line respectively; and orthographic projections of the eighth connecting trace and the ninth connecting trace on the substrate surface of the base substrate are overlapped with the orthographic projection of the fourth power line on the substrate surface of the base substrate.

For example, in the display substrate provided by at least one embodiment of the present disclosure, the third data test line includes a first part connected with its first end, a second part connected with its second end, and a tenth connecting trace; the first part and the second part of the third data test line are located in the second conductive layer, the tenth connecting trace is located in the first conductive layer; two ends of the tenth connecting trace are respectively connected with the first part and the second part of the third data test line; the control signal line includes a first part connected with its first end, a second part connected with its second end, and an eleventh connecting trace; the first part and the second part of the control signal line are located in the second conductive layer, the eleventh connecting trace is located in the first conductive layer; two ends of the eleventh connecting trace are respectively connected with the first part and the second part of the control signal line; and orthographic projections of the tenth connecting trace and the eleventh connecting trace on the substrate surface of the base substrate are overlapped with the orthographic projection of the fourth power line on the substrate surface of the base substrate.

For example, in the display substrate provided by at least one embodiment of the present disclosure, the signal access unit includes a plurality of signal access pads, and the first conductive layer further includes a twelfth connecting trace; one end of the twelfth connecting trace is connected with at least one of the plurality of signal access pads, and the other end of the twelfth connecting trace is connected with the control signal line.

At least one embodiment of the present disclosure provides a display device, including the display substrate described in any of the above.

BRIEF DESCRIPTION OF THE DRAWINGS

In order to more clearly illustrate the technical solutions of the embodiments of the present disclosure, the drawings of the embodiments will be briefly described in the following; it is obvious that the described drawings below are only related to some embodiments of the present disclosure without construing any limitation thereto.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, "a", "an" or "the" etc. are not intended to specify a quantitative limitation, but rather to specify the presence of at least one. Also, the terms "comprise," or "include," etc., are intended to specify that the elements or the objects stated before these terms encompass the elements or the objects and equivalents thereof listed after these terms. For the convenience of description, in some drawings, "up", "down", "front" and "back" are given. In the embodiments of the present disclosure, the vertical direction is the direction from up to down, and the vertical direction is the direction of gravity, the horizontal direction is the direction perpendicular to the vertical direction, and the horizontal direction from right to left is the direction from front to back.

Figure 1A:
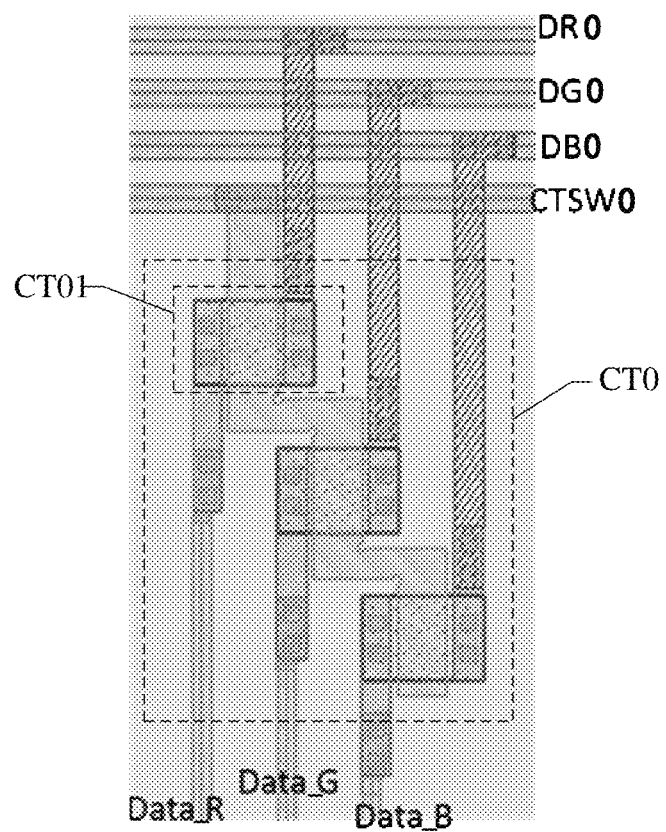
FIG. 1A is a schematic structural diagram of a test circuit unit of a display substrate.
Figure 1B:
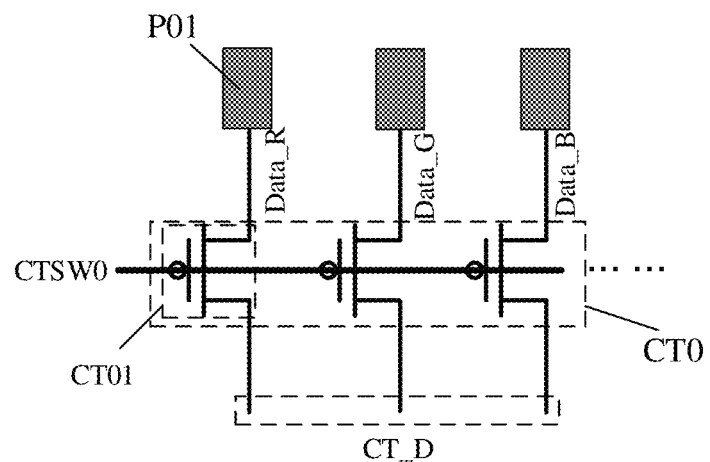
FIG. 1B is a schematic diagram of a working principle of a test circuit of a display substrate.

FIG. 1A is a schematic structural diagram of a test circuit unit of a display substrate; and FIG. 1B is a schematic diagram of a working principle of a test circuit of a display substrate.

The basic structure of a test unit CT0 commonly used in a test circuit of a display substrate of a wearable product is shown in FIG. 1A. For example, the test unit CT0 includes a plurality of test switches CT01. For example, the plurality of test switches CT01 include three test switches which are electrically connected with different data test signal lines respectively. In FIG. 1A, a first electrode (for example, one of a source electrode and a drain electrode) of the test unit CT0 receives DR0 data signal, DG0 data signal and DB0 data signal. The DR0 signal, the DG0 signal and the DB0 signal are data signals respectively, and are provided by different data test signal lines. For example, a gate electrode of the test unit CT0 (such as the test switch CT01) receives CTSW0 switch signal.

The working principle of the test circuit above is shown in FIG. 1B. For example, the working principle of the test circuit shown in FIG. 1A is that, the test unit CT01 turns on the test switch CT01 in response to the received switch signal, that is, the switch signal received through a control signal line CTSW0 connected with a gate electrode of the test switch CT01; a data signal (for example, DR0 data signal, DG0 data signal or DB0 data signal) transmitted through a data test signal line CT_D is supplied to a Data_R data line, a Data_G data line or a Data_B data line. For example, the Data_R data line, the Data_G data line and the Data_B data line are correspondingly connected with different columns of sub-pixels P10 respectively. At this time, data signals of all the sub-pixels have the same voltage, and only a solid color image can be displayed. If a shaded dot, such as a black dot, is appeared during detection, it indicates that an abnormal dot is detected in the display panel.

For example, for display devices, an impedance of the signal line plays an important role in the transmission efficiency of the signal and the display effect. As shown in FIG. 1A, for a commonly used test unit CT0, gate electrodes of the test switches CT01 are single-layered traces (for example, they located in a first gate electrode layer) and are respectively connected with the control signal line CTSW0. In such design, the impedance of the signal line is increased with a routing distance. For example, the gate electrodes of the three test switches CT01 shown in FIG. 1A have different distances from the control signal line in the longitudinal direction shown in the figure, and the test switch CT01 farther from the control signal line receives a signal with greater impedance. Moreover, the increase of the impedance of the signal will also cause uneven signal strength at the gate electrodes of the test switches CT01, thereby affecting the test results.

At least one embodiment of the present disclosure provides a display substrate. The display substrate includes a base substrate, a plurality of sub-pixels, a plurality of data lines, a control signal line, a plurality of data test lines, a test circuit and an auxiliary electrode line. The base substrate includes a display area and a peripheral area located at least at one side of the display area; the plurality of sub-pixels are located in the display area and arranged in an array; the plurality of data lines are located in the display area and configured to provide data signals to the plurality of sub-pixels; the control signal line is located in the peripheral area and located at least at one side of the display area; the plurality of data test lines are located in the peripheral area and located at least at one side of the display area; the test circuit is located in the peripheral area, electrically connected with the plurality of data lines, the control signal line and the plurality of data test lines, and is configured to transmit test signals to the plurality of data lines through the plurality of data test lines under a control of the control signal line; the test circuit includes a plurality of test units, each of at least one test unit of the plurality of test units includes a first control line and a plurality of control switches, the plurality of control switches include control terminals, and the first control line is connected with the control signal line and the control terminals of the plurality of control switches; the auxiliary electrode line is located in the peripheral area and is connected in parallel with the first control line, and an orthographic projection of a part of at least one control switch of the plurality of control switches on a substrate surface of the base substrate is located between an orthographic projection of the first control line and an orthographic projection of the auxiliary electrode line on the substrate surface of the base substrate.

At least one embodiment of the present disclosure also provides a display device including the display substrate described above.

In the display substrate and the display device provided by the above embodiments, the display substrate can reduce the impedance of the first control line, improve the transmission efficiency of the first control line, prevent from signal distortion, and provide more stable control signals for the test circuit.

Embodiments and examples of the present disclosure will be described in details below with reference to the accompanying drawings.

Figure 2:
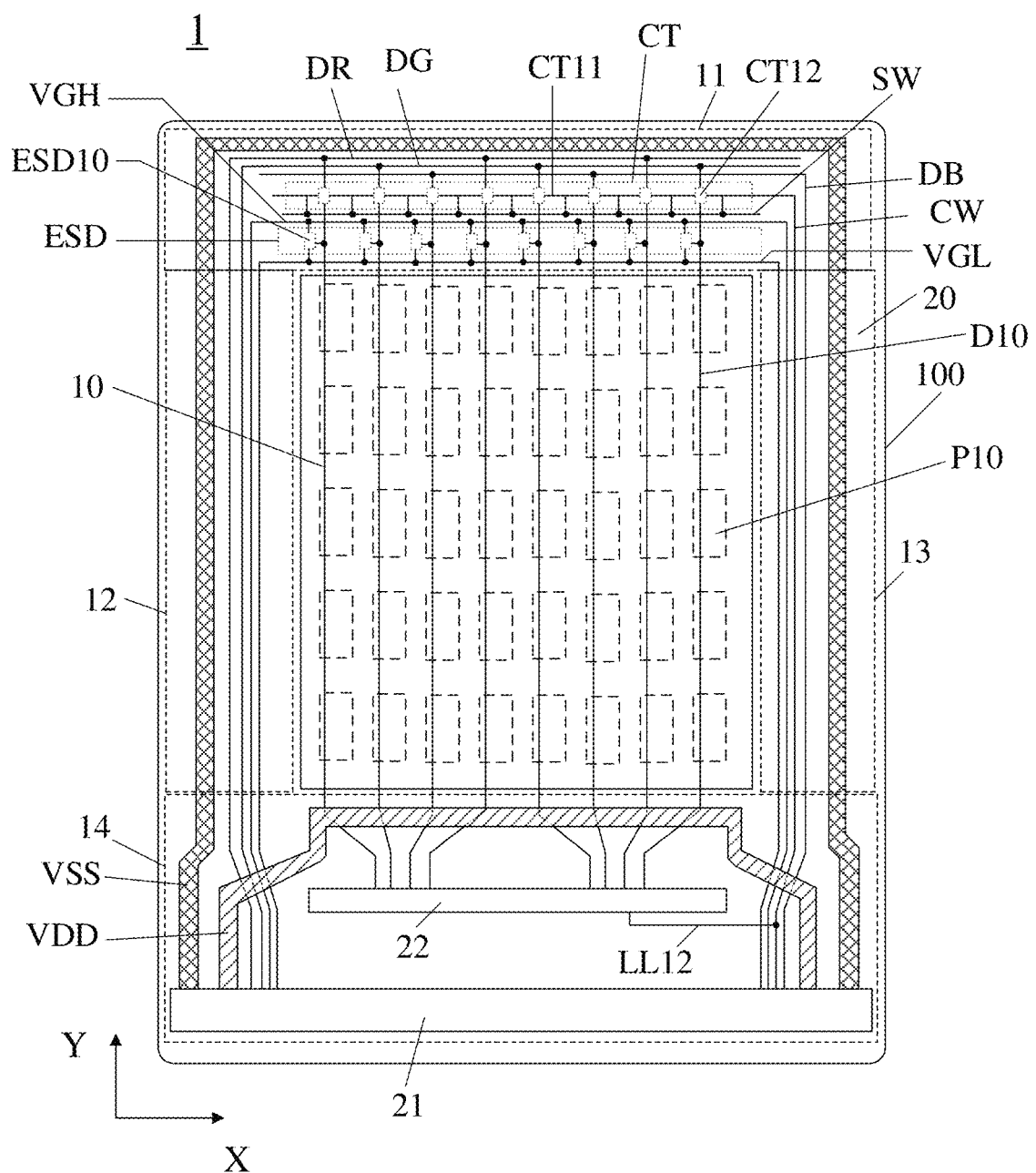
FIG. 2 is a schematic diagram of a display substrate provided by at least one embodiment of the present disclosure.
Figure 3:
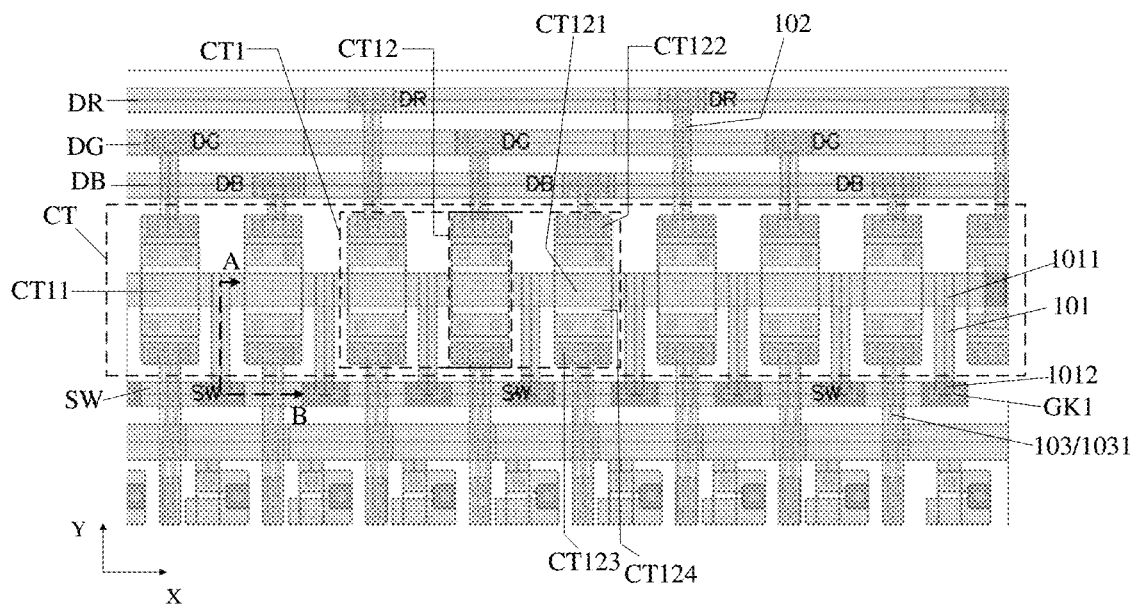
FIG. 3 is a schematic diagram illustrating a partial structure of a peripheral area of a display substrate, at a first side of a display area, according to at least one embodiment of the present disclosure.

FIG. 2 is a schematic diagram of a display substrate provided by at least one embodiment of the present disclosure. FIG. 3 is a schematic diagram illustrating a partial structure of a peripheral area of a display substrate, at a first side of a display area, according to at least one embodiment of the present disclosure.

For example, in some embodiments, as illustrated in FIG. 2, the display substrate 1 includes a base substrate 100. The base substrate 100 includes a display area 10 and a peripheral area 20. For example, the peripheral area 20 surrounds the display area 10. The display substrate 1 includes a plurality of sub-pixels P10. The plurality of sub-pixels P10 are located in the display area 10 and arranged in an array, for example, the sub-pixels P10 are arranged in a plurality of rows and a plurality of columns along a first direction X and a second direction Y. The display substrate 1 also includes a plurality of data lines D10 and a control signal line CW. The plurality of data lines D10 are located in the display area 10, for example, passing through the display area 10 along the second direction Y (the longitudinal direction). The plurality of data lines D10 are configured to provide data signals to corresponding columns of sub-pixels P10. The control signal line CW is located in the peripheral area 20 and is routed around at least one side of the display area 10, for example, the control signal line CW is routed around a third side 13 of the display area 10 (for example, the right side of the display area 10 in FIG. 2).

For example, in the present disclosure, an included angle between the first direction X and the second direction Y as mentioned is between 70° and 90° and includes both 70° and 90°. For example, the included angle between the first direction X and the second direction Y is 70°, 90° or 80°, which can be set according to actual situations without limited by the embodiments of the present disclosure. For example, the included angle between the first direction X and the second direction Y can also be 75°, 85°, etc.

For example, the base substrate 100 may be a glass plate, a quartz plate, a metal plate, a resin plate or the like. For example, a material of the base substrate can include organic materials, such as polyimide, polycarbonate, polyacrylate, polyetherimide, polyethersulfone, polyethylene terephthalate and polyethylene naphthalate, and other resin materials; for example, the base substrate 100 can be a flexible substrate or a non-flexible substrate, which is not limited by the embodiments of the present disclosure.

As illustrated in FIGS. 2 and 3, the display substrate 1 further includes a test circuit CT. The test circuit CT is located in the peripheral area 20, for example, at a first side 11 of the display area 10 (for example, the upper side of the display area 10 in FIG. 2). The test circuit CT is electrically connected with the data lines D10 respectively corresponding to the plurality of sub-pixels P10 to transmit test signals (e.g., data signals). The test circuit CT includes a plurality of test units CT1 (as illustrated in FIG. 3). Each of at least one test unit CT1 includes a first control line CT11 and a plurality of control switches CT12. Each of the plurality of control switches CT12 includes a control terminal CT121 (such as a gate electrode), and the first control line CT11 is connected with the control signal line CW and the control terminals CT121 of the plurality of control switches CT12 in the test unit CT1 to provide control signals to the plurality of control switches CT12. For example, the test circuit CT transmits test signals to the plurality of data lines D10 under the control of the control signal line CW (for example, through a plurality of data test lines DR/DG/DB). For example, the first control line CT11 and the control terminals CT121 of the control switches CT12 are arranged in the same layer and are integrally formed.

Figure 4:
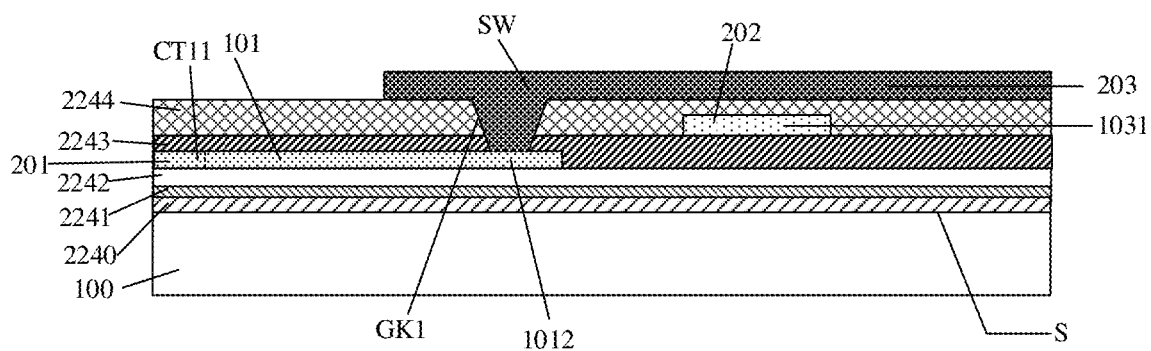
FIG. 4 is a sectional view taken along line A-B in FIG. 3.

For example, as illustrated in FIGS. 2 and 3, the display substrate 1 further includes an auxiliary electrode line SW. The auxiliary electrode line SW is located in the peripheral area 20, for example, at the first side 11 of the display area 10. For example, the routing directions of the auxiliary electrode line SW and the first control line CT11 are basically the same, for example, both extending along the first direction X. For example, the auxiliary electrode line SW and the first control line CT11 are connected in parallel with each other, and the orthographic projection of at least a part of at least one of the plurality of control switches CT12 on the substrate surface S of the base substrate 100 (as illustrated in FIG. 4) is located between the orthographic projection of the first control line CT11 and the orthographic projection of the auxiliary electrode line SW on the substrate surface S of the base substrate 100. For example, in FIG. 3, each of the plurality of control switches CT12 further includes a first terminal CT122 (for example, the terminal away from the auxiliary electrode line SW) and a second terminal CT123 (for example, the terminal close to the auxiliary electrode line SW); and the first control line CT11 and the auxiliary electrode line SW are spaced apart from each other by the second terminals CT123 of the plurality of control switches CT12. That is to say, the orthographic projections of the second terminals CT123 of the control switches CT12 on the substrate surface S of the base substrate 100 are located between the orthographic projection of the first control line CT11 and the orthographic projection of the auxiliary electrode line SW on the substrate surface S of the base substrate 100.

For example, the auxiliary electrode line SW and the first control line CT11 may not be parallel to the first direction X, for example, they may intersect with the first direction X at a certain angle. For example, the intersection angle is smaller than or equal to 20°.

For example, while connecting the control terminal CT121 of each of the plurality of control switches CT12 to the first control line CT11, the control terminals CT121 of the plurality of control switches CT12 are connected in series, so that the first control line CT11 and the auxiliary electrode line SW connected with the control terminal CT121 of each of the control switches CT12 constitute a parallel structure. According to the formula of parallel resistance that $R=(R_{CT11}+R_{SW})/(R_{CT11}*R_{SW})$, where $R_{CT11}$ represents the resistance of the first control line CT11 and $R_{SW}$ represents the resistance of the auxiliary electrode line SW, the impedance of the first control line CT11 will be decreased after the auxiliary electrode line SW and the first control line CT11 are connected in parallel.

In the above embodiment of the present disclosure, the display substrate 1 can reduce the impedance of the first control line CT11, improve the transmission efficiency of the first control line CT11, prevent from signal distortion and provide more stable control signals for the test circuit, without changing the structure or working performance of the control switch CT12.

It should be noted that, the case where the control switch CT12 is a P-type transistor is described by way of example. The control switch CT12 can also select an N-type transistor, and the embodiments of the present disclosure are not limited to this. For example, the control terminal CT121 of the control switch CT12 is a gate electrode of a transistor, and the first terminal CT122 and the second terminal CT123 of the control switch CT12 are a source electrode and a drain electrode of the transistor, respectively.

FIG. 4 is a sectional view taken along line A-B in FIG. 3.

For example, in some embodiments, as illustrated in FIGS. 3 and 4, the first control line CT11 and the auxiliary electrode line SW are located in different layers with respect to the base substrate 100, that is, they are not arranged in the same layer. For example, the first control line CT11 and the auxiliary electrode line SW are located in a first conductive layer 201 and a second conductive layer 203 which are spaced apart and insulated from each other. For example, the first conductive layer 201 and the second conductive layer 203 are spaced apart from each other by a second peripheral insulating layer 2243 and a peripheral interlayer insulating layer 2244. For example, the peripheral interlayer insulating layer 2244 is located at a side of the first conductive layer 201 away from the base substrate 100, the peripheral interlayer insulating layer 2244 is located at a side of the second peripheral insulating layer 2243 away from the base substrate 100, and the second conductive layer 203 is located at a side of the peripheral interlayer insulating layer 2244 away from the base substrate 100. Therefore, compared with the case where the auxiliary electrode line SW is located in the first conductive layer 201 (for example, in the same layer as the first control line CT11), the resistance value of the auxiliary electrode line SW of the present embodiment is increased, thereby further reducing the impedance of the first control line CT11.

For example, in some embodiments, the auxiliary electrode line SW is located at a side of the test circuit CT away from the display area 10 (for example, the upper side of the test circuit CT in FIG. 3) or a side close to the display area 10 (for example, the lower side of the test circuit CT in FIG. 3).

For example, in some embodiments, as illustrated in FIGS. 2 and 3, the display substrate 1 further includes an electrostatic discharge circuit ESD arranged between the test circuit CT and the display area 10. The electrostatic discharge circuit ESD is electrically connected with a plurality of data lines D10 to remove the electrostatic interference generated during the transmission of the test signals of the test circuit CT. The auxiliary electrode line SW is located between the test circuit CT and the electrostatic discharge circuit ESD, and then is connected in parallel with the first control line CT11.

For example, in some embodiments, as illustrated in FIG. 3, the display substrate 1 further includes a plurality of connecting wires 101. The plurality of connecting wires 101 are respectively arranged between the plurality of control switches CT12, that is, arranged in the gaps of the plurality of control switches CT12. The first control line CT11 is overlapped with the active layers CT124 of the plurality of control switches CT12, and the overlapped parts of the first control line CT11 and the active layers CT124 form the control terminals CT121 of the plurality of control switches CT12. For example, the first control line is integrally formed with the control terminal CT121 of the control switch CT12. For example, the first ends 1011 of the plurality of connecting wires 101 are connected with the first control line CT11, and the second ends 1012 of the plurality of connecting wires 101 are connected with the auxiliary electrode line SW, so that the first control line CT11 and the auxiliary electrode line SW form a parallel connection structure.

For example, as illustrated in FIG. 4, the plurality of connecting wires 101 and the first control line CT11 are arranged in the same layer, and are all located in the first conductive layer 201. For example, the plurality of connecting wires 101 and the first control line CT11 are integrally formed.

It should be noted that, in the embodiment of the present disclosure, "arranged in the same layer" includes the case that two functional layers or structural layers are in the same layer of the hierarchical structure of the display substrate and formed of the same material, that is, in the manufacturing process, the two functional layers or structural layers can be formed of the same material layer, and the required patterns and structures can be formed by the same patterning process. A single patterning process includes, for example, steps of photoresist forming, exposing, developing, etching and others.

For example, in some embodiments, as illustrated in FIGS. 2 and 3, the display substrate 1 further includes a plurality of data test lines (for example, a first data test line DR, a second data test line DG and a third data test line DB). The plurality of data test lines are located in the peripheral area 20 and are routed around at least one side (for example, the first side 11, the second side 12 and the third side 13) of the display area 10. The plurality of data test lines extend along the first direction X and are arranged at intervals at the side of the test circuit CT away from the display area 10 (above the test circuit CT in the figure). That is, at the first side 11 of the display area 10, the plurality of data test lines are routed along the first direction X. For example, each of the plurality of control switches CT12 is based on a control signal received at the control terminal CT121. For example, when the control switch CT12 is a P-type transistor and the control signal is at a low level, the control terminal CT121 of the control switch CT12 is turned on, so that the first terminal CT122 and the second terminal CT123 can transmit the test signal. The first terminals CT122 of the plurality of control switches CT12 are correspondingly connected with the plurality of data test lines, respectively, and are configured to receive test signals provided by the plurality of data test lines. The second terminals CT123 of the plurality of control switches CT12 are correspondingly electrically connected with the plurality of data lines D10, respectively, to provide test signals to the sub-pixels P10 of the display area 10.

For example, in some embodiments, as illustrated in FIG. 3, the display substrate 1 further includes a plurality of first lead segments 102 and a plurality of data leads 103. The plurality of first lead segments 102 and the plurality of data leads 103 extend along the second direction Y. For example, the plurality of first lead segments 102 are correspondingly connected with the plurality of data test lines (for example, the first data test line DR, the second data test line DG and the third data test line DB) and the first terminals CT122 of the plurality of control switches CT12 respectively. For example, the plurality of data leads 103 are correspondingly connected with the second terminals CT123 of the plurality of control switches CT12 and the plurality of data lines D10 respectively to provide test signals to the sub-pixel P10 of the display area 10 when the control switches CT12 are turned on.

For example, the plurality of first lead segments 102 and the plurality of data leads 103 may not be parallel to the second direction Y, for example, they may intersect with the second direction Y at a certain angle. For example, the intersection angle is smaller than or equal to 20°.

For example, in some embodiments, as illustrated in FIG. 3, each of the plurality of data leads 103 includes a second lead segment 1031. The plurality of second lead segments 1031 are correspondingly connected with the second terminals CT123 of the plurality of control switches CT12 and the electrostatic discharge circuit ESD respectively.

For example, as illustrated in FIG. 4, a plurality of first lead segments 102 and a plurality of second lead segments 1031 are located in a third conductive layer 202. The third conductive layer 202 is located between the first conductive layer 201 and the second conductive layer 203, and is spaced apart from the first conductive layer 201 and the second conductive layer 203. For example, the third conductive layer 202 is located between the second peripheral insulating layer 2243 and the peripheral interlayer insulating layer 2244. The third conductive layer 202 and the second conductive layer 203 are spaced apart from each other by the peripheral interlayer insulating layer 2244. The third conductive layer 202 and the first conductive layer 201 are spaced apart from each other by the second peripheral insulating layer 2243. For example, the first lead segment 102 is connected with the first terminal CT122 of the control switch CT12 through a via hole penetrating through the interlayer insulating layer 2244. For example, the second lead segment 1031 is connected with the second terminal CT123 of the control switch CT12 through a via hole penetrating through the interlayer insulating layer 2244. Orthographic projections of the plurality of second lead segments 1031 on the substrate surface S of the base substrate 100 and the orthographic projection of the auxiliary electrode line SW on the substrate surface S of the base substrate 100 are overlapped with each other. The plurality of second lead segments 1031 and the auxiliary electrode line SW are located in different layers to save wiring space.

For example, as illustrated in FIG. 3, the plurality of first lead segments 102 have no overlap with the first control line CT11, so as to prevent the first lead segment 102 and the first control line CT11 from generating a parasitic capacitance therebetween.

Figure 6:
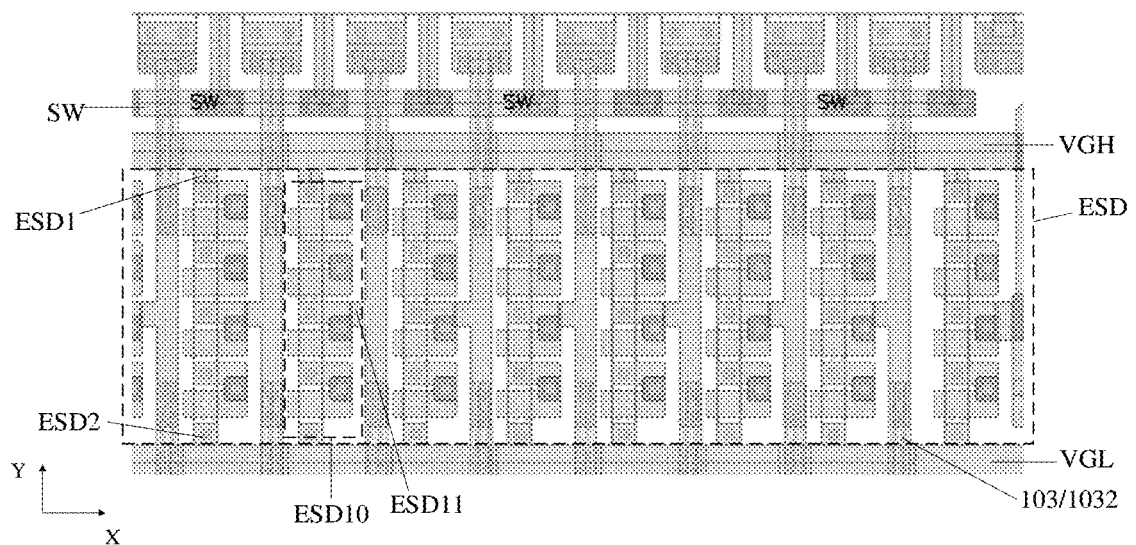
FIG. 6 is a schematic diagram illustrating another partial structure of the peripheral area of the display substrate, at the first side of the display area, according to at least one embodiment of the present disclosure.

FIG. 6 is a schematic diagram illustrating another partial structure of the peripheral area of the display substrate, at the first side of the display area, according to at least one embodiment of the present disclosure.

For example, in some embodiments, as illustrated in FIGS. 2 and 6, each of the plurality of data leads 103 further includes a third lead segment 1032. The third lead segment 1032 is located in the peripheral area 20, and is located between the display area 10 and the electrostatic discharge circuit ESD. For example, one end of each of a plurality of third lead segments 1032 (the end close to the electrostatic discharge circuit ESD) is electrically connected with a control terminal of the electrostatic discharge circuit ESD. The other ends of the plurality of third lead segments 1032 are correspondingly connected with the plurality of data lines D10 respectively to provide test signals to the sub-pixels P10 of the display area 10. For example, the third lead segment 1032 is located in the third conductive layer 202.

Figure 5:
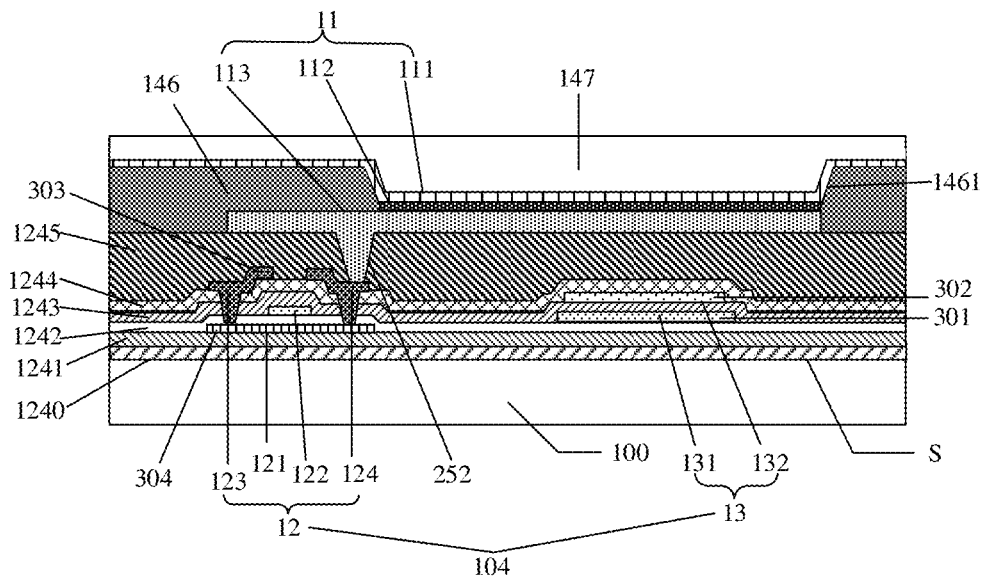
FIG. 5 is a schematic cross-sectional view of a display area of a display substrate provided by at least one embodiment of the present disclosure.

FIG. 5 is a schematic cross-sectional view of a display area of a display substrate provided by at least one embodiment of the present disclosure.

For example, in some embodiments, as illustrated in FIG. 5, each of the plurality of sub-pixels P10 includes a pixel structure. The pixel structure includes a pixel driving circuit 104 and a light-emitting element 11. The pixel driving circuit 104 includes a semiconductor layer 304, a first display area metal layer 301, a second display area metal layer 302, a third display area metal layer 303, a first insulating layer 1242 (i.e., a first gate insulating layer), a second insulating layer 1243 (i.e., a second gate insulating layer) and an interlayer insulating layer 1244. The light-emitting element 11 is located at a side of the pixel driving circuit 104 away from the base substrate 100, and is connected with the third display area metal layer 303 of the pixel driving circuit 104.

As illustrated in FIG. 5, the first insulating layer 1242 is located on the base substrate 100. The semiconductor layer 304 is located at a side of the first insulating layer 1242 close to the base substrate 100. The first display area metal layer 301 is located at a side of the first insulating layer 1242 away from the base substrate 100. The second insulating layer 1243 is located at a side of the first display area metal layer 301 away from the base substrate 100. The second display area metal layer 302 is located at a side of the second insulating layer 1243 away from the base substrate 100. The interlayer insulating layer 1244 is located at a side of the second display area metal layer 302 away from the base substrate. The third display area metal layer 303 is located at a side of the interlayer insulating layer 1244 away from the base substrate 100.

As illustrated in FIG. 5, the display substrate 1 may further include a buffer layer 1241 and a barrier layer 1240. The buffer layer 1241 is located at a side of the semiconductor layer 304 close to the base substrate 100, and the barrier layer 1240 is located at a side of the buffer layer 1241 close to the base substrate 100. The buffer layer 1241 serves as a transition layer, which can not only prevent harmful substances in the base substrate from intruding into the display substrate, but also can increase the adhesion of the film layer of the display substrate to the base substrate 100. The barrier layer 1240 can provide a flat surface for forming the pixel driving circuit 104, and can prevent impurities that may exist in the base substrate 100 from diffusing into the sub-pixel driving circuit or the pixel driving circuit 104 and adversely affecting the performance of the display substrate.

For example, the materials of one or more of the first insulating layer 1242, the second insulating layer 1243 and the interlayer insulating layer 1244 may include insulating materials such as silicon oxide, silicon nitride and silicon oxynitride. The materials of the first insulating layer 1242, the second insulating layer 1243 and the interlayer insulating layer 1244 may or may not be the same.

For example, the material of the buffer layer 1241 may include insulating materials such as silicon oxide, silicon nitride and silicon oxynitride. For example, the material of the barrier layer 1240 may include inorganic insulating materials such as silicon oxide, silicon nitride and silicon oxynitride, or other suitable materials.

For example, the material of the semiconductor layer 304 may include polysilicon or oxide semiconductor (for example, indium gallium zinc oxide (IGZO)).

For example, the materials of the first display area metal layer 301, the second display area metal layer 302, and the third display area metal layer 303 may include metal materials or alloy materials, such as a single-layered metal structure or a multi-layered metal structure formed of molybdenum, aluminum, titanium, etc., for example, the multi-layered structure is a multi-metal lamination (such as a three-layered metal lamination of titanium, aluminum and titanium (Ti/Al/Ti)). For example, the materials of the first display area metal layer 301, the second display area metal layer 302 and the third display area metal layer 303 may be the same or different, and the embodiments of the present disclosure are not limited thereto.

For example, in some embodiments, as illustrated in FIGS. 4 and 5, the first conductive layer 201 and the first display area metal layer 301 are arranged in the same layer. For example, the third conductive layer 202 and the second display area metal layer 302 are arranged in the same layer. For example, the second conductive layer 203 and the third display area metal layer 303 are arranged in the same layer. For example, active layers CT124 of the plurality of control switches CT12 and the semiconductor layer 304 are arranged in the same layer. For example, the second peripheral insulating layer 2243 and the second insulating layer 1243 are arranged in the same layer; and the peripheral interlayer insulating layer 2244 and the interlayer insulating layer 1244 are arranged in the same layer. Therefore, the process flow of the manufacturing method is simplified.

For example, as illustrated in FIG. 4, a plurality of connecting wires 101 are located in the first conductive layer 201, and second ends 1012 of the plurality of connecting wires 101 are connected with the auxiliary electrode line SW through a via hole GK1 penetrating through the second peripheral insulating layer 2243 and the peripheral interlayer insulating layer 2244 (for example, the second insulating layer 1243 and the interlayer insulating layer 1244).

For example, as illustrated in FIG. 4, in the peripheral area 20, the display substrate 1 further includes a first peripheral insulating layer 2242, a peripheral buffer layer 2241 and a peripheral barrier layer 2240. The first peripheral insulating layer 2242 is located at a side of the first conductive layer 201 close to the base substrate 100, the peripheral buffer layer 2241 is located at a side of the first peripheral insulating layer 2242 close to the base substrate 100, and the peripheral barrier layer 2240 is located at a side of the peripheral buffer layer 2241 close to the base substrate 100. For example, the first peripheral insulating layer 2242 and the first insulating layer 1242 are arranged in the same layer; the peripheral buffer layer 2241 and the buffer layer 1241 are arranged in the same layer; and the peripheral barrier layer 2240 and the barrier layer 1240 are arranged in the same layer.

For example, as illustrated in FIG. 5, the pixel driving circuit 104 further includes a first transistor 12 and a storage capacitor 13. The first transistor 13 includes a transistor directly electrically connected with the light-emitting element 11, the transistor for example is a switching transistor (e.g., a light emission control transistor) or a driving transistor. The first transistor 12 includes a gate electrode 122, a source-drain electrode (a source electrode 123 and a drain electrode 124), and an active layer 121. The gate electrode 122 is located in the first display area metal layer 301, the source-drain electrode (the source electrode 123 and the drain electrode 124) is located in the third display area metal layer 303, and the active layer 121 is located in the semiconductor layer 304. The storage capacitor 13 includes a first electrode plate 131 and a second electrode plate 132. For example, the first electrode plate 131 is located in the first display area metal layer 301, and the second electrode plate 132 is located in the second display area metal layer 302. The gate electrode 122 and the first electrode plate 131 are arranged in the same layer. The first electrode plate 131 and the second electrode plate 132 are spaced apart from each other by the second insulating layer 1243 to achieve a capacitance function.

For example, in some other embodiments, the first electrode plate 131 can be located at the second display area metal layer 302, and the second electrode plate 132 can be located at the third display area metal layer 303. At this time, the first electrode plate 131 and the second electrode plate 132 are spaced apart from each other by the interlayer insulating layer 1244. The embodiments of the present disclosure are not limited to the specific arrangement of the storage capacitor 13.

For example, as illustrated in FIG. 5, the display substrate 1 further includes a first planarization layer 1245. The first planarization layer 1245 provides a first planarization surface at a side of the source electrode 123 and the drain electrode 124 (that is, the pixel driving circuit 104) away from the base substrate 100, so as to planarize a surface of the pixel driving circuit 104 away from the base substrate 100. The first planarization layer 1245 includes a first via hole 252 through which the pixel driving circuit 104 (for example, the third display area metal layer 303) is electrically connected with the light-emitting element.

For example, the material of the first planarization layer 1245 includes inorganic insulating materials such as silicon oxide, silicon nitride and silicon oxynitride, and may also include organic insulating materials such as polyimide, polyphthalimide, polyamide, acrylic resin, benzocyclobutene or phenolic resin, which is not limited in the embodiments of the present disclosure.

For example, as illustrated in FIG. 5, the display substrate 1 further includes a pixel defining layer 146. The light-emitting element 11 is arranged at a side of a second planarization layer 1245 away from the base substrate 100. The light-emitting element 11 includes a first electrode 113 (e.g., anode), a light-emitting layer 112, and a second electrode 111 (e.g., cathode). The first electrode 113 is located at a side of the first planarization layer 1245 away from the base substrate 100, and is electrically connected with the pixel driving circuit 104 (for example, the drain electrode 124 of the first transistor 12) through the via hole 252. The second electrode 111 is located at a side of the pixel defining layer 146 away from the base substrate 100. The pixel defining layer 146 is located at a side of the first electrode 113 away from the base substrate 100 and includes a first pixel opening 1461. The first pixel opening 1461 is arranged corresponding to the light-emitting element 11. The light-emitting layer 112 is located in the first pixel opening 1461 and is located between the first electrode 113 and the second electrode 111. A part of the light-emitting layer 112 that is directly sandwiched between the first electrode 113 and the second electrode 111 will emit light after being energized, so an area occupied by this part corresponds to the light-emitting area of the light-emitting element 11.

For example, the pixel driving circuit 104 generates a light-emitting driving current under the control of the data signal (e.g., test signal) provided by the data line D10, the gate scanning signal and light-emitting control signal provided by, for example, a shift register, and other signals. The light-emitting driving current enables the light-emitting element 11 to emit red light, green light, blue light, or white light, etc.

For example, the pixel driving circuit 104 includes a 2T1C (i.e., two transistors and one capacitor) pixel circuit, a 7T1C (i.e., seven transistors and one capacitor) pixel circuit and the like which are commonly used. The pixel driving circuit 104 includes at least one switching transistor and one driving transistor (such as the first transistor 12 in FIG. 5); the gate electrode of the switching transistor receives the gate scanning signal, and the source electrode or drain electrode of the switching transistor is connected with the data line D10 to receive the data signal. In another different embodiment, the pixel driving circuit 104 may further include a compensation circuit including an internal compensation circuit or an external compensation circuit, and the compensation circuit may include a transistor, a capacitor and the like. For example, the pixel circuit may further include a reset circuit, a light emission control circuit, a detection circuit and the like, as required. The embodiments of the present disclosure are not intended to limit the type of the first light-emitting device and the specific structure of the pixel circuit.

For example, the material of the pixel defining layer 146 may include organic insulating materials such as polyimide, polyphthalimide, polyamide, acrylic resin, benzocyclobutene or phenolic resin, or inorganic insulating materials such as silicon oxide and silicon nitride, which are not limited by the embodiments of the present disclosure.

For example, the material of the first electrode 113 may include at least one transparent conductive oxide material including indium tin oxide (ITO), indium zinc oxide (IZO), zinc oxide (ZnO) and the like. Moreover, the first electrode 113 may include a metal with high reflectivity as a reflective layer; for example, the metal is silver (Ag).

For example, for OLED, the light-emitting layer 112 may include small molecular organic materials or polymer molecular organic materials, may include fluorescent materials or phosphorescent materials, and may emit red light, green light, blue light or emit white light; furthermore, the light-emitting layer may further include functional layers such as electron injection layer, electron transport layer, hole injection layer and hole transport layer, as required.

For example, for QLED, the light-emitting layer 112 may include quantum dot materials such as silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, etc., and the particle diameter of the quantum dots is 2 nm-20 nm.

For example, the second electrode 111 may include various conductive materials. For example, the second electrode 111 may include metal materials such as lithium (Li), aluminum (Al), magnesium (Mg), silver (Ag), etc.

For example, as illustrated in FIG. 5, the display substrate 1 further includes an encapsulation layer 147. The encapsulation layer 147 is located at a side of the second electrode 111 away from the base substrate 100. The encapsulation layer 147 seals the light-emitting element 11 (light-emitting element 11), so that the deterioration of the light-emitting element 11 caused by moisture and/or oxygen contained in the environment can be reduced or avoided. The encapsulation layer 147 may have a single-layered structure or a multi-layered structure, and the multi-layered structure includes a stacked structure of inorganic layers and organic layers. The encapsulation layer 147 includes at least one encapsulation sublayer. For example, the encapsulation layer 147 may include a first inorganic encapsulation layer, a first organic encapsulation layer, and a second inorganic encapsulation layer which are sequentially arranged.

For example, the material of the encapsulation layer 147 may include insulating materials such as silicon nitride, silicon oxide, silicon oxynitride and polymer resin. Inorganic materials such as silicon nitride, silicon oxide and silicon oxynitride have high density, and can prevent from the invasion of water and oxygen. The material of the organic encapsulation layer can be a polymer material containing a desiccant or a polymer material that can block water vapor, such as polymer resin, so as to planarize the surface of the display substrate and relieve the stress of the first inorganic encapsulation layer and the second inorganic encapsulation layer; and the material of the organic encapsulation layer may also include a water-absorbing material such as a desiccant, so as to absorb water, oxygen and other substances invading into the interior.

Figure 7A:
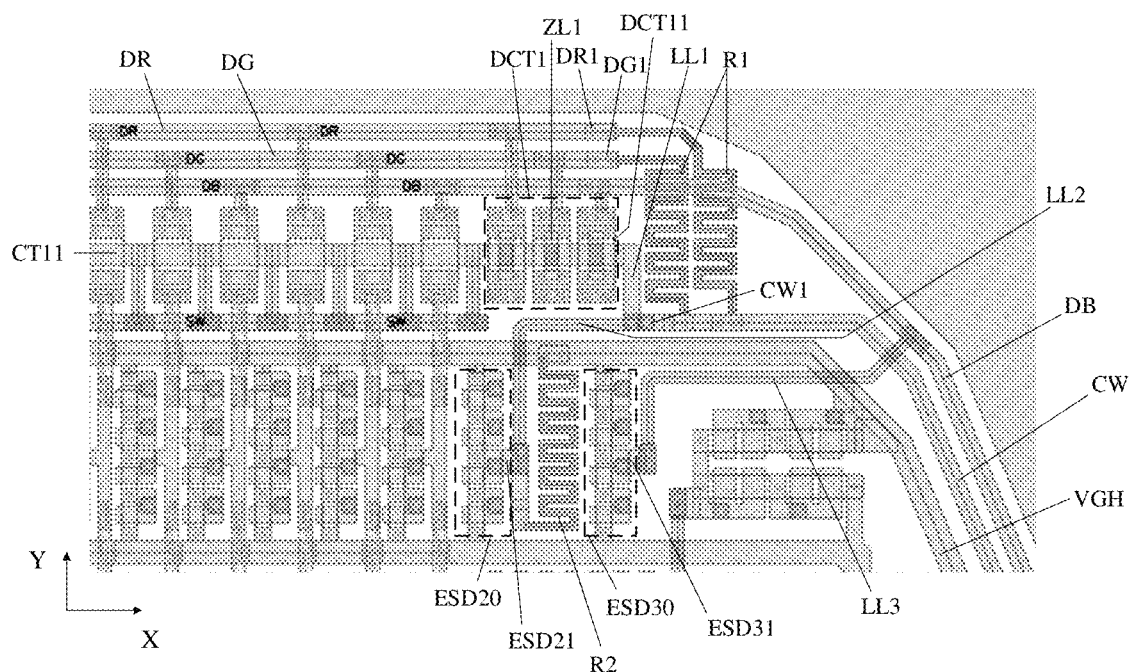
FIG. 7A is a schematic diagram illustrating yet another partial structure of the peripheral area of the display substrate, at the first side of the display area, according to at least another embodiment of the present disclosure.
Figure 7B:
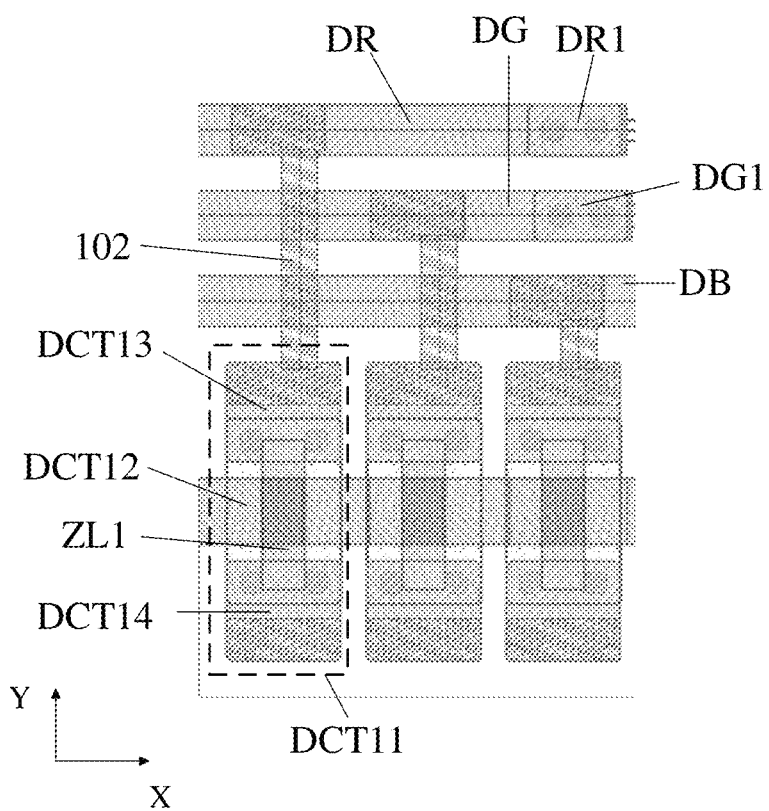
FIG. 7B is an enlarged view of a dummy test unit in FIG. 7A.

FIG. 7A is a schematic diagram illustrating yet another partial structure of the peripheral area of the display substrate, at the first side of the display area, according to at least another embodiment of the present disclosure; and FIG. 7B is an enlarged view of a dummy test unit in FIG. 7A.

For example, in some embodiments, as illustrated in FIGS. 7A and 7B, the test circuit CT further includes at least one dummy test unit DCT1, and the at least one dummy test unit DCT1 is located at a side of the test circuit CT away from the plurality of test units CT1. For example, the number of the at least one dummy test unit DCT1 is at least two, and the at least one dummy test unit DCT1 is arranged at both sides of the test circuit CT away from the plurality of test units CT1. The second conductive layer 203 includes a plurality of first adapter electrodes ZL1. For example, each of the at least one dummy test unit DCT1 includes a plurality of dummy control switches DCT11. First terminals DCT13 of the plurality of dummy control switches DCT11 are correspondingly connected with a plurality of data test lines (for example, the first data test line DR, the second data test line DG and the third data test line DB), respectively. For example, control terminals DCT12 of the plurality of dummy control switches DCT11 are connected with the first control line CT11. For example, the plurality of adapter electrodes ZL1 are provided in the plurality of dummy control switches DCT11 in one-to-one correspondence. The adapter electrode ZL1 connects the first terminal DCT13 and the second terminal DCT14 of the dummy control switch DCT11. That is to say, the dummy control switch DCT11 is additionally provided with adapter electrodes ZL1, as compared with the structure of the control switch CT12. The arrangement of the dummy test unit DCT1 can increase the uniformity of the traces in the peripheral area 20 at the first side 11 of the display area 10.

For example, in some embodiments, as illustrated in FIGS. 2 and 6, the display substrate 1 further includes a plurality of power lines (for example, including a first power line VGH and a second power line VGL). The plurality of power lines are routed around at least one side of the display area 10 (for example, the first side 11, the second side 12 and the third side 13). For example, the plurality of power lines include a first power line VGH configured to provide a first power signal (e.g., a high-level voltage signal) and a second power line VGL configured to provide a second power signal (e.g., a low-level voltage signal). At least a part of the first power line VGH and at least a part of the second power line VGL are located in the second conductive layer 203. For example, a part of the first power line VGH and a part of the second power line VGL that are routed to be overlapped with other traces (for example, a fourth power line VDD in FIG. 2) are located in the first conductive layer 201. For example, at the first side 11 of the display area 10, the first power line VGH is routed at a side of the electrostatic discharge circuit ESD away from the display area 10, and the second power line VGL is routed at a side of the electrostatic discharge circuit ESD close to the display area 10. The first power line VGH and the second power line VGL are respectively connected with a first terminal ESD1 and a second terminal ESD2 of the electrostatic discharge circuit ESD. For example, the electrostatic discharge circuit ESD includes a plurality of first electrostatic discharge units ESD10. For example, the ends of the plurality of second lead segments 1031 away from the test circuit CT are correspondingly connected with the control terminals ESD11 of the plurality of first electrostatic discharge units ESD10 respectively.

For example, the first electrostatic discharge units ESD10 are implemented as a plurality of transistors connected in series. One of the source electrode and drain electrode (e.g., the first terminal ESD1 and the second terminal ESD2) of each transistor is connected in short circuit with the control terminal (e.g., the control terminal ESD11) to form a diode structure so as to obtain unidirectional conduction characteristics. When the signal transmitted by the second lead segment 1031 connected with the first electrostatic discharge unit ESD10 is a high-level signal, the first electrostatic discharge unit ESD10 is turned on, thereby exporting the static electricity on the second lead segment 1031. That is to say, the first electrostatic discharge unit ESD10 is configured to export the static electricity of test signals provided by data test signal lines (for example, the first data test line DR, the second data test line DG and the third data test line DB) on a transmission path to the data lines D10.

For example, as illustrated in FIG. 2, the test circuit CT and the electrostatic discharge circuit ESD are located at the first side of the display area 10. The second side 12 and the third side 13 of the display area 10 are opposite to each other and are adjacent to the first side 11; and the fourth side 14 of the display area 10 is opposite to the first side 11. Referring to FIG. 7A, the plurality of data test lines include a first data test line DR, a second data test line DG and a third data test line DB. The first data test line DR and the second data test line DG (for example, at least partially) are routed around the second side 12 and the first side 11 of the display area 10; and the second data test line DG is located at a side of the first data test line DR close to the display area 10. The third data test line DB and the control signal line CW (for example, at least partially) are routed around the third side 13 and the first side 11 of the display area 10; and the control signal line CW is located at a side of the third data test line DB close to the display area 10. For example, at the side of the test circuit CT away from the display area 10, the second data test line DG is located between the first data test line DR and the third data test line DB; and the first data test line DR is located at a side away from the test circuit CT. For example, the first data test line DR, the second data test line DG and the third data test line DB are spaced apart from each other and are arranged in parallel along the second direction Y.

For example, as illustrated in FIG. 7A, the first conductive layer 201 includes a first connecting trace LL1 extending along the second direction Y. The semiconductor layer 304 includes a plurality of first resistors RE The first end CW1 of the control signal line CW is located at the first side 11 of the display area 10 and is close to the test circuit CT; for example, the control signal line CW extends to the side of the test circuit CT close to the third side 13 of the display area 10. One end of the first connecting trace LL1 is connected with the first end CW1 of the control signal line CW (for example, through a via hole penetrating through the second peripheral insulating layer 2243 and the peripheral interlayer insulating layer 2244), and the other end of the first connecting trace LL1 is connected with the end of the first control line CT11 close to the third side 13 of the display area 10. For example, the first control line CT11 and the first connecting trace LL1 are arranged in the same layer and are integrally formed to simplify the manufacturing process. For example, the first end DR1 of the first data test line DR and the first end DG1 of the second data test line DG are located at the side of the test circuit CT away from the display area 10, that is, at the side of the dummy test unit DCT1 (the dummy test unit DCT1 is close to the third side 13 of the display area 10) away from the display area 10. For example, one of the plurality of first resistors R1 (e.g., at least one of the first resistors) is connected (e.g., through a via hole penetrating through the first peripheral insulating layer 2242, the second peripheral insulating layer 2243 and the peripheral interlayer insulating layer 2244) to the first end DR1 of the first data test line DR and the control signal line CW; and another one of the plurality of first resistors R1 (e.g., at least another one of the first resistors) is connected with the first end DG1 of the second data test line DG and the control signal line CW. The first resistor R1 can prevent the first end DR1 of the first data test line DR and the first end DG1 of the second data test line DG from generating static electricity therebetween.

For example, the first connecting trace LL1 may not be parallel to the second direction Y, for example, it may intersect with the second direction Y at a certain angle. For example, the intersection angle is smaller than or equal to 20°.

Figure 8:
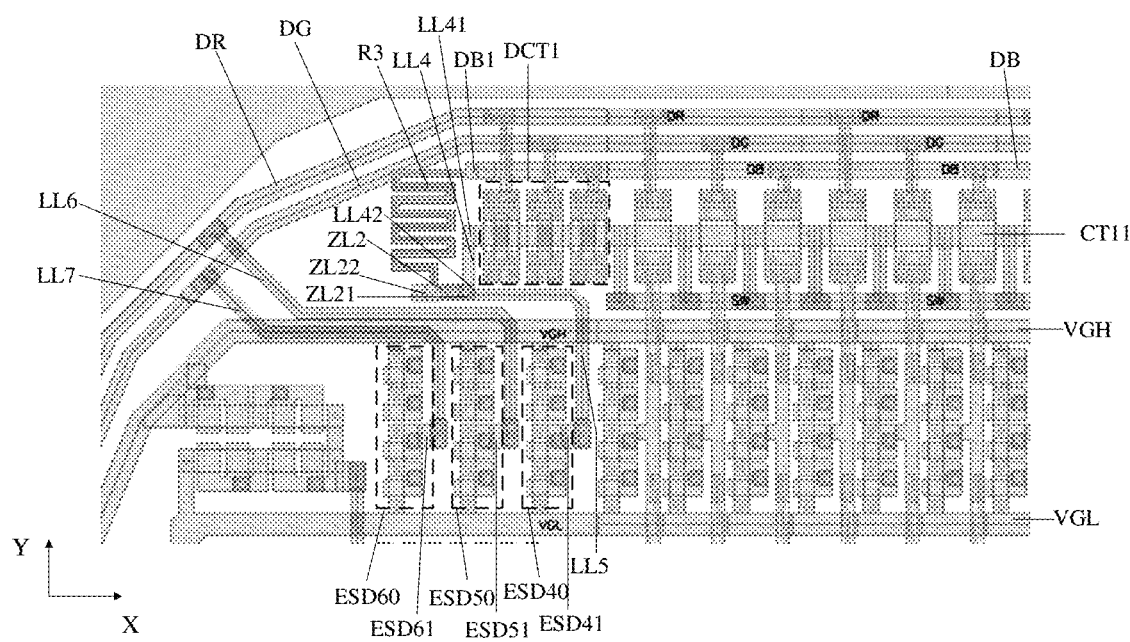
FIG. 8 is a schematic diagram illustrating further another partial structure of the peripheral area of the display substrate, at the first side of the display area, according to at least one embodiment of the present disclosure.

FIG. 8 is another structural schematic diagram of the peripheral area of a display substrate at the first side of the display area provided by at least one embodiment of the present disclosure.

For example, in some embodiments, as illustrated in FIGS. 7A and 8, at least one of the first data test line DR, the second data test line DG, the third data test line DB, the control signal line CW and the first control line CT11 is connected with the electrostatic discharge circuit ESD. For example, the first data test line DR, the second data test line DG, the third data test line DB, the control signal line CW and the first control line CT11 are electrically connected with different electrostatic discharge units in the static discharge circuit ESD, respectively, to remove static electricity generated by the first data test line DR, the second data test line DG, the third data test line DB, the control signal line CW and the first control line CT11 during signal transmission.

For example, in some embodiments, as illustrated in FIG. 7A, the electrostatic discharge circuit ESD further includes a second electrostatic discharge unit ESD20. The second electrostatic discharge unit ESD20 is located at a side of the plurality of first electrostatic discharge units ESD10 close to the third side 13 of the display area 10 (for example, at the right side of the plurality of first electrostatic discharge units ESD10). For example, the first conductive layer 201 includes a second connecting trace LL2, and the semiconductor layer 304 includes a second resistor R2. For example, the second connecting trace LL2 is overlapped with the first power line VGH. For example, the second connecting trace LL2 is an approximately L-shaped trace. One end of the second connecting trace LL2 is connected with a control terminal ESD21 of the second electrostatic discharge unit ESD20 (for example, through a via hole penetrating through the second peripheral insulating layer 2243 and the peripheral interlayer insulating layer 2244), and the other end of the second connecting trace LL2 is connected with the first end CW1 of the control signal line CW to remove static electricity generated by the first end CW1 of the control signal line CW. The second resistor R2 is located at a side of the second electrostatic discharge unit ESD20 away from the first electrostatic discharge unit ESD10. The second resistor R2 connects the control terminal ESD21 of the second electrostatic discharge unit ESD20 and the first power line VGH (for example, through a via hole penetrating through the first peripheral insulating layer 2242, the second peripheral insulating layer 2243 and the peripheral interlayer insulating layer 2244) to prevent the control terminal ESD21 of the second electrostatic discharge unit ESD20 from generating static electricity.

For example, in some embodiments, as illustrated in FIG. 7A, the first conductive layer 201 further includes a third connecting trace LL3. For example, the third connecting trace LL3 is overlapped with the first power line VGH and the control signal line CW, and the third connecting trace LL3 is a bending trace. The electrostatic discharge circuit ESD further includes a third electrostatic discharge unit ESD30. The third electrostatic discharge unit ESD30 is located at a side of the second electrostatic discharge unit ESD20 close to the third side 13 of the display area 10 (for example, the right side in the figure). For example, one end of the third connecting trace LL3 is connected with the third data test line DB (for example, through a via hole penetrating through the second peripheral insulating layer 2243 and the peripheral interlayer insulating layer 2244), and the other end of the third connecting trace LL3 is connected with a control terminal ESD31 of the third electrostatic discharge unit ESD30 (for example, through a via hole penetrating through the second peripheral insulating layer 2243 and the peripheral interlayer insulating layer 2244) to remove static electricity from the third data test line DB.

For example, in some embodiments, as illustrated in FIG. 8, the first conductive layer 201 further includes a fourth connecting trace LL4. For example, the fourth connecting trace LL4 extends along the second direction Y. For example, the fourth connecting trace LL4 and the first connecting trace LL1 are symmetrically arranged to increase the uniformity of the traces. For example, a first end LL41 of the fourth connecting trace LL4 is connected with an end of the first control line CT11 close to the second side 12 of the display area 10. For example, the fourth connecting trace LL4 and the first control line CT11 are arranged in the same layer and are integrally formed to simplify the manufacturing process. For example, the semiconductor layer 304 includes a third resistor R3. The second conductive layer 203 includes a second adapter electrode ZL2, which extends along the first direction X. For example, a second end LL42 of the fourth connecting trace LL4 is connected with a first terminal ZL21 of the second adapter electrode ZL2 (for example, through a via hole penetrating through the second peripheral insulating layer 2243 and the peripheral interlayer insulating layer 2244). For example, the first end DB1 of the third data test line DB is located at the side of the test circuit CT away from the display area 10. For example, the third data test line DB extends from the first side 11 of the display area 10 towards a direction approaching the second side 12. For example, the third resistor R3 connects a second terminal ZL22 of the second adapter electrode ZL2 and the first end DB1 of the third data test line DB (for example, through a via hole penetrating through the first peripheral insulating layer 2242, the second peripheral insulating layer 2243 and the peripheral interlayer insulating layer 2244).

For example, for example, the fourth connecting trace LL4 may not be parallel to the second direction Y, for example, it may intersect with the second direction Y at a certain angle. For example, the intersection angle is smaller than or equal to 20°. The second adapter electrode ZL2 may not be parallel to the first direction X, for example, it may intersect with the first direction X at a certain angle. For example, the intersection angle is smaller than or equal to 20°.

For example, in some embodiments, as illustrated in FIG. 8, the first conductive layer 201 further includes a fifth connecting trace LL5. For example, the electrostatic discharge circuit ESD further includes a fourth electrostatic discharge unit ESD40, which is located at a side (for example, the left side) of the plurality of first electrostatic discharge units ESD10 close to the second side 12 of the display area 10. For example, the fifth connecting trace LL5 is an approximately L-shaped trace. For example, one end of the fifth connecting trace LL5 is connected with the second end LL42 of the fourth connecting trace LL4 (for example, through a via hole penetrating through the second peripheral insulating layer 2243 and the peripheral interlayer insulating layer 2244). The other end of the fifth connecting trace LL5 is connected with a control terminal ESD41 of the fourth electrostatic discharge unit ESD40 to remove the static electricity generated by the first control line CT11.

For example, in some embodiments, as illustrated in FIG. 8, the first conductive layer 201 further includes a sixth connecting trace LL6 and a seventh connecting trace LL7. The sixth connecting trace LL6 and the seventh connecting trace LL7 are bending traces. For example, the electrostatic discharge circuit ESD further includes a fifth electrostatic discharge unit ESD50 and a sixth electrostatic discharge unit ESD60. The sixth electrostatic discharge unit ESD60 is located at a side (for example, the left side) of the fourth electrostatic discharge unit ESD40 close to the second side 12 of the display area 10. For example, the fifth electrostatic discharge unit ESD50 is located between the fourth electrostatic discharge unit ESD40 and the sixth electrostatic discharge unit ESD60. For example, one end of the sixth connecting trace LL6 is connected with the first data test line DR (for example, through a via hole penetrating through the second peripheral insulating layer 2243 and the peripheral interlayer insulating layer 2244), and the other end of the sixth connecting trace LL6 is connected with a control terminal ESD51 of the fifth electrostatic discharge unit ESD50 (for example, through a via hole penetrating through the second peripheral insulating layer 2243 and the peripheral interlayer insulating layer 2244) to remove static electricity generated by the first data test line DR. For example, one end of the seventh connecting trace LL7 is connected with the second data test line DG (for example, through a via hole penetrating through the second peripheral insulating layer 2243 and the peripheral interlayer insulating layer 2244), and the other end of the seventh connecting trace LL7 is connected with a control terminal ESD61 of the sixth electrostatic discharge unit ESD60 (for example, through a via hole penetrating through the second peripheral insulating layer 2243 and the peripheral interlayer insulating layer 2244) to remove static electricity generated by the second data test line DG.

Figure 9:
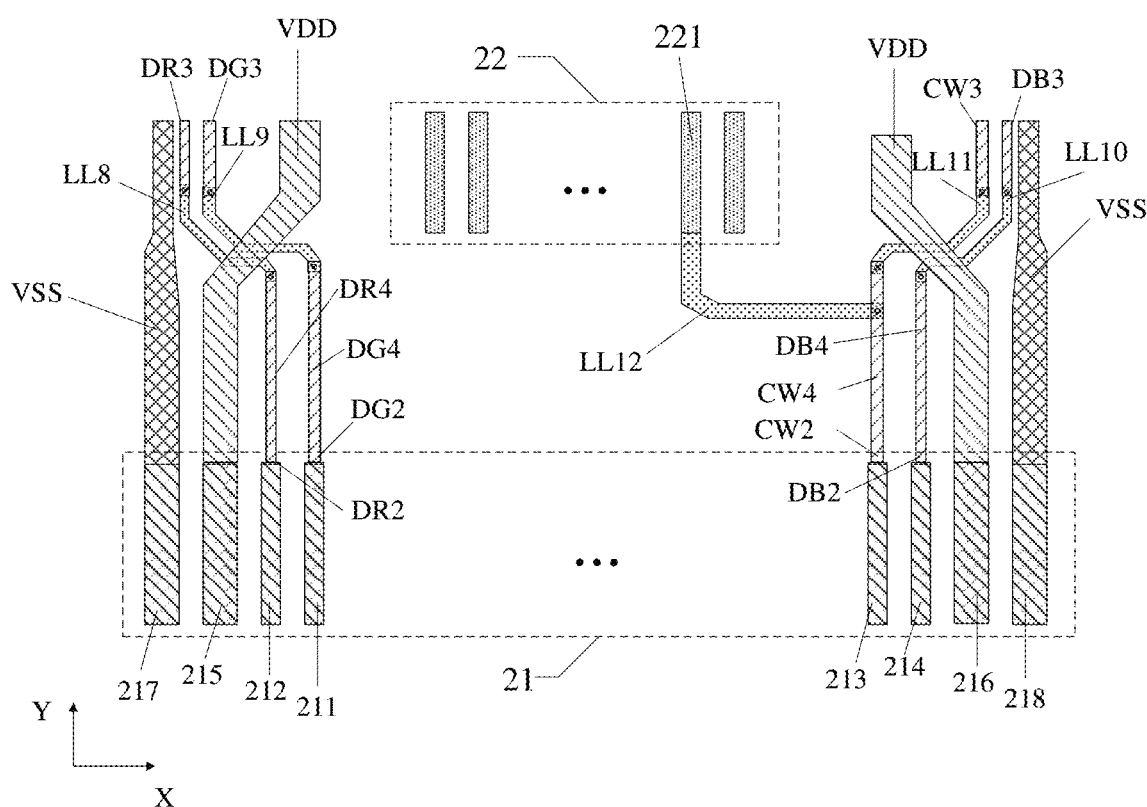
FIG. 9 is a schematic diagram illustrating a partial structure of the peripheral area of the display substrate, at a fourth side of the display area, according to at least one embodiment of the present disclosure.

FIG. 9 is a schematic diagram illustrating a partial structure of the peripheral area of the display substrate, at a fourth side of the display area, according to at least one embodiment of the present disclosure.

For example, in some embodiments, as illustrated in FIGS. 2 and 9, the display substrate 1 further includes a bonding area 21 and a signal access unit 22 located at the fourth side 14 of the display area 10. For example, in the second direction Y, the signal access unit 22 is located between the bonding area 21 and the display area 10. The bonding area 21 includes a plurality of contact pads arranged along the first direction X. The plurality of contact pads include a first contact pad 211 and a second contact pad 212 close to the second side 12 of the display area 10 (for example, at the left side of the bonding area 21), and a third contact pad 213 and a fourth contact pad 214 close to the third side 13 of the display area 10 (for example, at the right side of the bonding area 21). For example, the second end DR2 of the first data test line DR extends to the fourth side 14 of the display area 10 and is connected with the second contact pad 212. The second end DG2 of the second data test line DG extends to the fourth side 14 of the display area 10 and is connected with the first contact pad 211. For example, the second end CW2 of the control signal line CW extends to the fourth side 14 of the display area 10 and is connected with the third contact pad 213. The second end DB2 of the third data test line DB extends to the fourth side 14 of the display area 10 and is connected with the fourth contact pad 214. The plurality of contact pads are configured to be electrically connected with an external test circuit (for example, by bonding, by probe contact, etc.) in a test stage to apply test signals to the sub-pixels P10 through the test circuit CT, so as to test the performance of the sub-pixels P10 of the display substrate 1 in displaying black-and-white images, monochrome images and gray-scale images, etc.

For example, the signal access unit 22 is configured to be bonded with a signal input element; for example, the signal input element includes an integrated circuit (IC); for another example, the signal input element includes a data driving circuit IC. The signal input element provides a display signal of the display substrate 1 in the display stage, so that the sub-pixels P10 display an image.

For example, in some embodiments, parts of the first data test line DR, the second data test line DG, the third data test line DB and the control signal line CW are located in the second conductive layer 203. For example, the other parts of the first data test line DR, the second data test line DG, the third data test line DB and the control signal line CW are located in the first conductive layer 201.

For example, in some embodiments, as illustrated in FIGS. 2 and 9, the plurality of power lines further include a third power line VSS and a fourth power line VDD. The third power line VSS is configured to provide a third power signal to the plurality of sub-pixels P10. The fourth power line VDD is configured to provide a fourth power signal to the plurality of sub-pixels P10.

It should be noted that, the fourth power line VDD is a power line that supplies high voltage to the plurality of sub-pixels P10, and the third power line VSS is a power line that supplies low voltage (lower than the above-mentioned high voltage) to the plurality of sub-pixels P10. In the embodiment of the present disclosure, the fourth power line VDD provides a constant, fourth power voltage, which is a positive voltage; and the third power line VSS provides a constant, third power voltage, which may be a negative voltage or the like. For example, in some examples, the third power voltage may be a ground voltage.

For example, as illustrated in FIGS. 2 and 9, for example, the plurality of contact pads of the bonding area 21 further include a fifth contact pad 215, a sixth contact pad 216, a seventh contact pad 217 and an eighth contact pad 218. For example, the seventh contact pad 217 is located at a side of the second contact pad 212 close to the second side 12 of the display area 10 (for example, the left side in FIG. 9), and the eighth contact pad 218 is located at a side of the fourth contact pad 214 close to the third side 13 of the display area 10 (for example, the right side in FIG. 9). For example, the fifth contact pad 215 is located between the seventh contact pad 217 and the second contact pad 212; and the sixth contact pad 216 is located between the fourth contact pad 214 and the eighth contact pad 218. For example, two ends of the third power line VSS are respectively connected with the seventh contact pad 217 and the eighth contact pad 218, and the third power line VSS is routed around the display area 10 (for example, the second side 12, the third side 13 and the fourth side 14). The third power line VSS is located at the side of the first data test line DR and the third data test line DB away from the display area 10. For example, two ends of the fourth power line VDD are respectively connected with the fifth contact pad 215 and the sixth contact pad 216, and the fourth power line VDD is routed between the signal access unit 22 and the display area 10 and extends to the display area 10. For example, an orthographic projection of the fourth power line VDD on the substrate surface S of the base substrate 100 is overlapped with orthographic projections of the first data test line DR, the second data test line DG, the third data test line DB and the control signal line CW on the substrate surface S of the base substrate 100 to reduce the wiring space.

For example, in some embodiments, as illustrated in FIG. 9, in an area where the orthographic projection of the fourth power line VDD on the substrate surface S of the base substrate 100 is overlapped with the orthographic projections of the first data test line DR, the second data test line DG, the third data test line DB and the control signal line CW on the substrate surface S of the base substrate 100, the fourth power line VDD is located in the second conductive layer 203, and the first data test line DR, the second data test line DG, the third data test line DB and the control signal line CW are spaced apart from and insulated from the second conductive layer 203. For example, in this area, the first data test line DR, the second data test line DG, the third data test line DB and the control signal line CW are located in the first conductive layer 201.

For example, in some embodiments, as illustrated in FIG. 9, the first data test line DR includes a first part DR3 connected with its first end DR1, a second part DR4 connected with its second end DR2, and an eighth connecting trace LL8. For example, the first part DR3 and the second part DR4 of the first data test line DR are located in the second conductive layer 203, and the eighth connecting trace LL8 is located in the first conductive layer 201. Two ends of the eighth connecting trace LL8 are connected with the first part DR3 and the second part DR4 of the first data test line DR, respectively (for example, through a via hole penetrating through the second peripheral insulating layer 2243 and the peripheral interlayer insulating layer 2244). For example, the second data test line DG includes a first part DG3 connected with its first end DG1, a second part DG4 connected with its second end DG2, and a ninth connecting trace LL9. For example, the first part DG3 and the second part DG4 of the second data test line DG are located in the second conductive layer 203, the ninth connecting trace LL9 is located in the first conductive layer LL9, and two ends of the ninth connecting trace LL9 are connected with the first part DG3 and the second part DG4 of the second data test line DG, respectively (for example, through a via hole penetrating through the second peripheral insulating layer 2243 and the peripheral interlayer insulating layer 2244). For example, the eighth connecting trace LL8 and the ninth connecting trace LL9 are bending traces. For example, orthographic projections of the eighth connecting trace LL8 and the ninth connecting trace LL9 on the substrate surface S of the base substrate 100 are overlapped with the orthographic projection of the fourth power line VDD on the substrate surface S of the base substrate 100 (for example, at the left side of the signal access unit 22 in FIG. 9) to reduce the wiring space.

For example, in some embodiments, as illustrated in FIG. 9, the third data test line DB includes a first part DB3 connected with its first end DB1, a second part DB4 connected with its second end DB2, and a tenth connecting trace LL10. For example, the first part DB3 and the second part DB4 of the third data test line DB are located in the second conductive layer 203, the tenth connecting trace LL10 is located in the first conductive layer 201, and two ends of the tenth connecting trace LL10 are connected with the first part DB3 and the second part DB4 of the third data test line DB, respectively (for example, through a via hole penetrating through the second peripheral insulating layer 2243 and the peripheral interlayer insulating layer 2244). For example, the control signal line CW includes a first part CW3 connected with its first end CW1, a second part CW4 connected with its second end CW2, and an eleventh connecting trace LL11. For example, the first part CW3 and the second part CW4 of the control signal line CW are located in the second conductive layer 203, and the eleventh connecting trace LL11 is located in the first conductive layer 201. Two ends of the eleventh connecting trace LL11 are connected with the first part CW3 and the second part CW4 of the control signal line CW, respectively (for example, through a via hole penetrating through the second peripheral insulating layer 2243 and the peripheral interlayer insulating layer 2244). For example, the tenth connecting trace LL10 and the eleventh connecting trace LL11 are bending traces. For example, orthographic projections of the tenth connecting trace LL10 and the eleventh connecting trace LL11 on the substrate surface S of the base substrate 100 are overlapped with the orthographic projection of the fourth power line VDD on the substrate surface S of the base substrate 100 (for example, at the right side of the signal access unit 22 in FIG. 9) to reduce the wiring space.

It should be noted that, the first power line VGH and the second power line VGL also extend to the fourth side 14 of the display area 10, and are connected with other contact pads of the bonding area 21. The first power line VGH and the second power line VGL are also overlapped with the fourth power line VDD at the fourth side 14 of the display area 10; and in the overlapped area, the first power line VGH and the second power line VGL are routed by changing the layer where they are routed. At the fourth side 14 of the display area 10, the routing modes of the first power line VGH and the second power line VGL are similar to those of the first data test line DR, the second data test line DG, the third data test line DB and the control signal line CW, which will not be described in details here.

For example, in some embodiments, as illustrated in FIG. 9, the signal access unit 22 includes a plurality of signal access pads 221. The first conductive layer 201 further includes a twelfth connecting trace LL12. One end of the twelfth connecting trace LL12 is connected with at least one of the plurality of signal access pads 221, and the other end of the twelfth connecting trace LL12 is connected with the control signal line CW (for example, the second part CW4) (for example, through a via hole penetrating through the second peripheral insulating layer 2243 and the peripheral interlayer insulating layer 2244). The twelfth connecting trace LL12 can provide a control signal to the test circuit CT through the control signal line CW in the display stage to turn off the test circuit CT, so that the sub-pixels P10 can display an image based on the display signal provided by the signal input unit.

Figure 10:
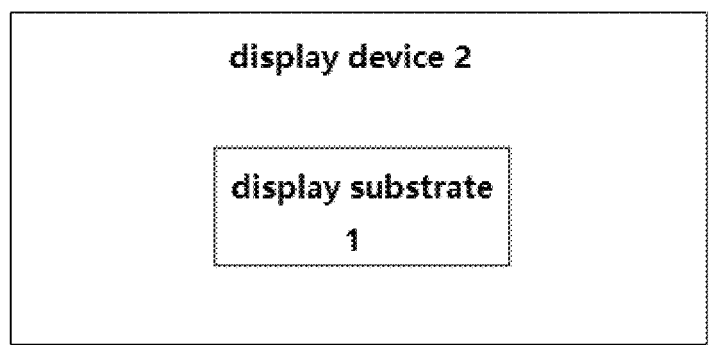
FIG. 10 is a schematic diagram of a display device provided by at least one embodiment of the present disclosure.

FIG. 10 is a schematic diagram of a display device provided by at least one embodiment of the present disclosure.

At least one embodiment of the present disclosure also provides a display device. FIG. 10 is a schematic diagram of a display device according to an embodiment of the present disclosure. As illustrated in FIG. 10, the display device 2 includes the display substrate 1 provided by any of the embodiments of the present disclosure and a signal input element. For example, the display substrate 1 illustrated in FIG. 2 is used as the display substrate 1. For example, the signal input element includes a data driving circuit IC. For example, the data driving circuit IC may be bonded with the signal access unit 22 of the display substrate 1. The data driving circuit IC provides the display signal of the display substrate 1 in the display stage, so that the sub-pixels P10 display an image.

It should be noted that the display device 2 can be a wearable device. For example, the display device 2 can also be any product or component with display function such as an OLED panel, an OLED TV, an QLED panel, an QLED Television, a mobile phone, a tablet computer, a notebook computer, a digital photo frame, a navigator, etc. The display device 2 may also include other components, such as a data driving circuit, a timing controller, etc., which is not limited by the embodiments of the present disclosure.

It should be noted that, for the sake of clarity and conciseness, the embodiments of the present disclosure do not show all the constituent units of the display device. In order to realize the substrate functions of the display device, a person skilled in the art can provide and configure other structures not illustrated, according to specific demands, which are not limited in the embodiments of the present disclosure.

For the technical effects of the display device 2 provided in the above embodiments, reference can be made to the technical effects of the display substrate 1 provided in the embodiments of the present disclosure, which will not be repeated here.

It should be explained as follows.

(1) In the drawings of the embodiments of the present disclosure, only the structures related to the embodiments of the present disclosure are involved, and other structures may refer to the common design(s).

(2) In case of no conflict, features in one embodiment or in different embodiments of the present disclosure can be combined.

The above are merely specific embodiments of the present disclosure, and the scope of protection of the present disclosure are not limited thereto. Any modifications or substitutions that can be easily made by those skilled who are familiar with the prior art without departing from the technical scope revealed in the present disclosure belong to the scope of protection sought to be protected by the present disclosure. Therefore, the scope of protection of the present disclosure should be defined by the appended claims.

What is claimed is:

1. A display substrate, comprising:
a base substrate, comprising a display area and a peripheral area at least located at one side of the display area;
a plurality of sub-pixels located in the display area and arranged in an array;
a plurality of data lines located in the display area and configured to provide data signals to the plurality of sub-pixels;
a control signal line located in the peripheral area and at least located at one side of the display area;
a plurality of data test lines located in the peripheral area and at least located at one side of the display area;
a test circuit located in the peripheral area and electrically connected with the plurality of data lines, the control signal line and the plurality of data test lines, respectively, and configured to transmit test signals to the plurality of data lines through the plurality of data test lines under a control of the control signal line, wherein the test circuit comprises a plurality of test units, and each of at least one test unit of the plurality of test units comprises a first control line and a plurality of control switches, and each of the plurality of control switches comprises a control terminal, the first control line is connected with the control signal line and control terminals of the plurality of control switches; and
an auxiliary electrode line located in the peripheral area and connected in parallel with the first control line, and an orthographic projection of a part of at least one control switch of the plurality of control switches on a substrate surface of the base substrate is located between an orthographic projection of the first control line on the substrate surface of the base substrate and an orthographic projection of the auxiliary electrode line on the substrate surface of the base substrate.

2. The display substrate according to claim 1, wherein the first control line and the auxiliary electrode line are located in different layers with respect to the base substrate, and
the first control line and the auxiliary electrode line are respectively located in a first conductive layer and a second conductive layer which are spaced apart and insulated from each other.

3. The display substrate according to claim 2, wherein the auxiliary electrode line is located at a side of the test circuit away from the display area or located at a side of the test circuit close to the display area.

4. The display substrate according to claim 3, further comprising an electrostatic discharge circuit arranged between the test circuit and the display area, wherein
the electrostatic discharge circuit is electrically connected with the plurality of data lines, and
the auxiliary electrode line is located between the test circuit and the electrostatic discharge circuit.

5. The display substrate according to claim 4, further comprising a plurality of connecting wires respectively arranged between the plurality of control switches, wherein
the first control line is overlapped with active layers of the plurality of control switches, and overlapped parts of the first control line and the active layers form the control terminals of the plurality of control switches, and
first ends of the plurality of connecting wires are connected with the first control line, and second ends of the plurality of connecting wires are connected with the auxiliary electrode line.

6. The display substrate according to claim 4, wherein the plurality of data test lines extend along a first direction at the side of the test circuit away from the display area and are arranged at intervals along a second direction, and the first direction intersects with the second direction,
each of the plurality of control switches further comprises a first terminal and a second terminal, first terminals of the plurality of control switches are correspondingly connected with the plurality of data test lines respectively and are configured to receive test signals provided by the plurality of data test lines, and second terminals of the plurality of control switches are correspondingly electrically connected with the plurality of data lines, respectively.

7. The display substrate according to claim 6, further comprising a plurality of first lead segments and a plurality of data leads, the plurality of first lead segments and the plurality of data leads extending along the second direction, wherein the plurality of first lead segments is correspondingly connected with the plurality of data test lines and the first terminals of the plurality of control switches, respectively, and the plurality of data leads is correspondingly connected with the second terminals of the plurality of control switches and the plurality of data lines, respectively.

8. The display substrate according to claim 7, wherein the plurality of data leads comprises second lead segments, a plurality of the second lead segments is correspondingly connected with the second terminals of the plurality of control switches and the electrostatic discharge circuit, respectively, the plurality of first lead segments and the plurality of second lead segments are located in a third conductive layer, and the third conductive layer is located between the first conductive layer and the second conductive layer and is spaced apart from and insulated from the first conductive layer and the second conductive layer, and orthographic projections of the plurality of second lead segments on the substrate surface of the base substrate and the orthographic projection of the auxiliary electrode on the substrate surface of the base substrate are overlapped with each other.

9. The display substrate according to claim 8, wherein the plurality of data leads further comprises third lead segments, the third lead segments are located in the peripheral area and located between the display area and the electrostatic discharge circuit, one end of each of a plurality of the third lead segments is electrically connected with a control terminal of the electrostatic discharge circuit, and other ends of the plurality of third lead segments are correspondingly connected with the plurality of data lines, respectively, and the third lead segments are located in the third conductive layer.

10. The display substrate according to claim 8, wherein at least one of the plurality of sub-pixels comprises a pixel driving circuit and a light-emitting element, wherein the pixel driving circuit comprises a semiconductor layer, a first display area metal layer, a second display area metal layer and a third display area metal layer, and the light-emitting element is located at a side of the pixel driving circuit away from the base substrate and is connected with the third display area metal layer of the pixel driving circuit, a first insulating layer is located on the base substrate, the semiconductor layer is located at a side of the first display area metal layer close to the base substrate, the second display area metal layer is located at a side of the first display area metal layer away from the base substrate, the third display area metal layer is located at a side of the second display area metal layer away from the base substrate, and the first conductive layer and the first display area metal layer are arranged in a same layer, the third conductive layer and the second display area metal layer are arranged in a same layer, the second conductive layer and the third display area metal layer are arranged in a same layer, the active layers of the plurality of control switches and the semiconductor layer are arranged in a same layer, and the plurality of connecting wires are is located in the first conductive layer, and the second ends of the plurality of connecting wires are connected with the auxiliary electrode line.

11. The display substrate according to claim 10, wherein the pixel driving circuit further comprises a first transistor and a storage capacitor, the first transistor comprises a gate electrode, a source electrode, a drain electrode and an active layer, and the storage capacitor comprises a first electrode plate and a second electrode plate, the active layer of the first transistor is located in the semiconductor layer, the gate electrode and the first electrode plate are located in the first display area metal layer, the second electrode plate is located in the second display area metal layer, and the source electrode and the drain electrode are located in the third display area metal layer.

12. The display substrate according to claim 10, wherein the test circuit further comprises at least one dummy test unit, the at least one dummy test unit is located at a side of the test circuit away from the plurality of test units, and the second conductive layer comprises a plurality of first adapter electrodes, each of the at least one dummy test unit comprises a plurality of dummy control switches, first terminals of the plurality of dummy control switches are correspondingly connected with the plurality of data test lines, respectively, control terminals of the plurality of dummy control switches are connected with the first control line, and the plurality of first adapter electrodes is respectively connected with the first terminals and second terminals of the plurality of dummy control switches.

13. The display substrate according to claim 10, further comprising a plurality of power lines routed around at least one side of the display area, wherein the plurality of power lines comprises a first power line configured to provide a first power signal and a second power line configured to provide a second power signal, at least part of the first power line and at least part of the second power line are located in the second conductive layer, the first power line is routed at a side of the electrostatic discharge circuit away from the display area, the second power line is routed at a side of the electrostatic discharge circuit close to the display area, and the first power line and the second power line are respectively connected with a first terminal and a second terminal of the electrostatic discharge circuit, the electrostatic discharge circuit comprises a plurality of first electrostatic discharge units, ends of the plurality of second lead segments away from the test circuit are correspondingly connected with control terminals of the plurality of first electrostatic discharge units, respectively.

14. The display substrate according to claim 10, wherein the test circuit and the electrostatic discharge circuit are located at a first side of the display area; and a second side and a third side of the display area are opposite to each other and adjacent to the first side,
- the plurality of data test lines comprises a first data test line, a second data test line and a third data test line, at least part of the first data test line and at least part of the second data test line are routed around the second side and the first side of the display area, and the second data test line is located at a side of the first data test line close to the display area,
- at least part of the third data test line and at least part of the control signal line are routed around the third side and the first side of the display area, and the control signal line is located at a side of the third data test line close to the display area,
- at a side of the test circuit away from the display area, the second data test line is located between the first data test line and the third data test line, the first data test line is located at a side away from the test circuit, the first conductive layer comprises a first connecting trace extending along the second direction, and the semiconductor layer comprises a plurality of first resistors,
- a first end of the control signal line is located at the first side of the display area and close to the test circuit, one end of the first connecting trace is connected with the first end of the control signal line, and the other end of the first connecting trace is connected with an end of the first control line close to the third side of the display area,
- a first end of the first data test line and a first end of the second data test line are located at the side of the test circuit away from the display area,
- at least one of the plurality of first resistors is connected with the first end of the first data test line and to the control signal line, and at least another one of the plurality of first resistors is connected with the first end of the second data test line and to the control signal line.

15. The display substrate according to claim 14, wherein at least one selected from a group consisting of the first data test line, the second data test line, the third data test line, the control signal line and the first control line is connected with the electrostatic discharge circuit.

16. The display substrate according to claim 15, wherein the electrostatic discharge circuit further comprises a second electrostatic discharge unit which is located at least at one side of the plurality of first electrostatic discharge units and is located at a side close to the third side of the display area,
- the first conductive layer comprises a second connecting trace and a third connecting trace, the semiconductor layer comprises a second resistor,
- one end of the second connecting trace is connected with a control terminal of the second electrostatic discharge unit, and the other end of the second connecting trace is connected with the first end of the control signal line,
- the second resistor is connected with the control terminal of the second electrostatic discharge unit and the first power line,
- the electrostatic discharge circuit further comprises a third electrostatic discharge unit which is located at a side of the second electrostatic discharge unit close to the third side of the display area, and
- one end of the third connecting trace is connected with the third data test line, and the other end of the third connecting trace is connected with a control terminal of the third electrostatic discharge unit.

17. The display substrate according to claim 14, further comprising a bonding area and a signal access unit located at a fourth side of the display area opposite to the first side, wherein the signal access unit is located between the bonding area and the display area, and the bonding area comprises a plurality of contact pads arranged along the first direction,
- the plurality of contact pads comprises a first contact pad and a second contact pad which are close to the second side of the display area, and a third contact pad and a fourth contact pad which are close to the third side of the display area,
- a second end of the first data test line extends to the fourth side of the display area and is connected with the second contact pad, and a second end of the second data test line extends to the fourth side of the display area and is connected with the first contact pad,
- a second end of the control signal line extends to the fourth side of the display area and is connected with the third contact pad, and
- a second end of the third data test line extends to the fourth side of the display area and is connected with the fourth contact pad.

18. The display substrate according to claim 17, wherein the first data test line, the second data test line, the third data test line and the control signal line are partly located in the second conductive layer.

19. The display substrate according to claim 17, wherein the plurality of power lines further comprises a third power line and a fourth power line,
- the third power line is configured to provide a third power signal to the plurality of sub-pixels,
- the fourth power line is configured to provide a fourth power signal to the plurality of sub-pixels,
- the plurality of contact pads further comprises a fifth contact pad, a sixth contact pad, a seventh contact pad and an eighth contact pad,
- the seventh contact pad is located at a side of the second contact pad close to the second side of the display area, and the eighth contact pad is located at a side of the fourth contact pad close to the third side of the display area,
- the fifth contact pad is located between the seventh contact pad and the second contact pad, and the sixth contact pad is located between the fourth contact pad and the eighth contact pad,
- two ends of the third power line are respectively connected with the seventh contact pad and the eighth contact pad, the third power line is routed around the display area, and the third power line is located at a side of the first data test line and the third data test line away from the display area,
- two ends of the fourth power line are respectively connected with the fifth contact pad and the sixth contact pad; and the fourth power line is routed between the signal access unit and the display area and extends to the display area,
- an orthographic projection of the fourth power line on the substrate surface of the base substrate is overlapped with orthographic projections of the first data test line, the second data test line, the third data test line and the control signal line on the substrate surface of the base substrate, and
- in an area where the orthographic projection of the fourth power line on the substrate surface of the base substrate is overlapped with the orthographic projections of the first data test line, the second data test line, the third data test line and the control signal line on the substrate surface of the base substrate, the fourth power line is located in the second conductive layer, and the first data test line, the second data test line, the third data test line and the control signal line are spaced apart from and insulated from the second conductive layer.

20. A display device, comprising the display substrate according to claim 1.

* * * * *